(12) United States Patent
Ito

(10) Patent No.: US 10,297,694 B2
(45) Date of Patent: May 21, 2019

(54) SEMICONDUCTOR DEVICE AND METHOD FOR MANUFACTURING SAME

(71) Applicant: Sharp Kabushiki Kaisha, Sakai, Osaka (JP)

(72) Inventor: Kazuatsu Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/767,699

(22) PCT Filed: Oct. 13, 2016

(86) PCT No.: PCT/JP2016/080332
§ 371 (c)(1),
(2) Date: Apr. 12, 2018

(87) PCT Pub. No.: WO2017/065199
PCT Pub. Date: Apr. 20, 2017

(65) Prior Publication Data
US 2018/0301566 A1    Oct. 18, 2018

(30) Foreign Application Priority Data

Oct. 14, 2015    (JP) ................................ 2015-202707

(51) Int. Cl.
*H01L 21/28*      (2006.01)
*H01L 27/08*      (2006.01)
(Continued)

(52) U.S. Cl.
CPC ........ *H01L 29/78696* (2013.01); *H01L 21/28* (2013.01); *H01L 21/8234* (2013.01);
(Continued)

(58) Field of Classification Search
CPC ............. H01L 29/78696; H01L 29/045; H01L 29/247; H01L 29/423; H01L 29/42364;
(Continued)

(56) References Cited

U.S. PATENT DOCUMENTS 6,534,788 B1 * 3/2003 Yeo .................... H01L 29/41733
257/66
2011/0084262 A1    4/2011 Kondratyuk et al.
(Continued)

FOREIGN PATENT DOCUMENTS

JP      2010-003910 A    1/2010
JP      2011-082486 A    4/2011
(Continued)

*Primary Examiner* — Mark W Tornow
(74) *Attorney, Agent, or Firm* — Keating & Bennett, LLP

(57) ABSTRACT

A semiconductor device includes a first thin film transistor (101) on a substrate (10), the first thin film transistor including: a sub-gate electrode (12); a first insulating layer (14) covering the sub-gate electrode; a main gate electrode (16) formed on the first insulating layer; a second insulating layer (18) covering the main gate electrode; an oxide semiconductor layer (20) having a layered structure of a first layer (20A) and a second layer (20B), the second layer having a larger band gap than the first layer; a first source electrode (22); and a first drain electrode (24), wherein as seen from a direction normal to the substrate, the oxide semiconductor layer (20) includes: a gate opposing region (20g) that overlaps the main gate electrode; a source contact region that is in contact with the first source electrode (22); a drain contact region that is in contact with the first drain electrode; and an offset region (30s, 30d) that is provided at least one of between the gate opposing region and the source contact region and between the gate opposing region and the drain contact region, wherein at least a portion of the offset region overlaps the sub-gate electrode (12) with the first (Continued)

insulating layer (14) and the second insulating layer (18) therebetween.

18 Claims, 14 Drawing Sheets

(51) Int. Cl.
    *H01L 27/32*       (2006.01)
    *H01L 29/04*       (2006.01)
    *H01L 29/24*       (2006.01)
    *H01L 29/49*       (2006.01)
    *H01L 29/66*       (2006.01)
    *H01L 27/088*     (2006.01)
    *H01L 29/423*     (2006.01)
    *H01L 29/786*     (2006.01)
    *H01L 21/8234*    (2006.01)

(52) U.S. Cl.
    CPC ...... *H01L 21/823412* (2013.01); *H01L 27/08* (2013.01); *H01L 27/088* (2013.01); *H01L 27/3262* (2013.01); *H01L 29/045* (2013.01); *H01L 29/247* (2013.01); *H01L 29/423* (2013.01); *H01L 29/42364* (2013.01); *H01L 29/42372* (2013.01); *H01L 29/49* (2013.01); *H01L 29/4908* (2013.01); *H01L 29/66969* (2013.01); *H01L 29/786* (2013.01); *H01L 29/7869* (2013.01); *H01L 29/78645* (2013.01)

(58) Field of Classification Search
    CPC ............... H01L 29/42372; H01L 29/49; H01L 29/4908; H01L 29/66969; H01L 29/786; H01L 29/78645; H01L 29/7869; H01L 21/28; H01L 21/8234; H01L 21/823412; H01L 27/08; H01L 27/088; H01L 27/3262
    See application file for complete search history.

(56) References Cited

U.S. PATENT DOCUMENTS

| | | |
|---|---|---|
| 2012/0138922 A1 | 6/2012 | Yamazaki et al. |
| 2013/0009219 A1 | 1/2013 | Yamazaki et al. |
| 2013/0320334 A1 | 12/2013 | Yamazaki et al. |
| 2014/0014947 A1 | 1/2014 | Yamazaki |
| 2014/0286076 A1 | 9/2014 | Aoki et al. |
| 2014/0353605 A1* | 12/2014 | Kim ................... H01L 27/124 257/40 |
| 2015/0206818 A1* | 7/2015 | Choi ................. G02F 1/133345 349/46 |

FOREIGN PATENT DOCUMENTS

| | | |
|---|---|---|
| JP | 2012-134475 A | 7/2012 |
| JP | 2013-038399 A | 2/2013 |
| JP | 2014-007399 A | 1/2014 |
| JP | 2014-033194 A | 2/2014 |
| JP | 2014-209727 A | 11/2014 |

* cited by examiner

FIG.1
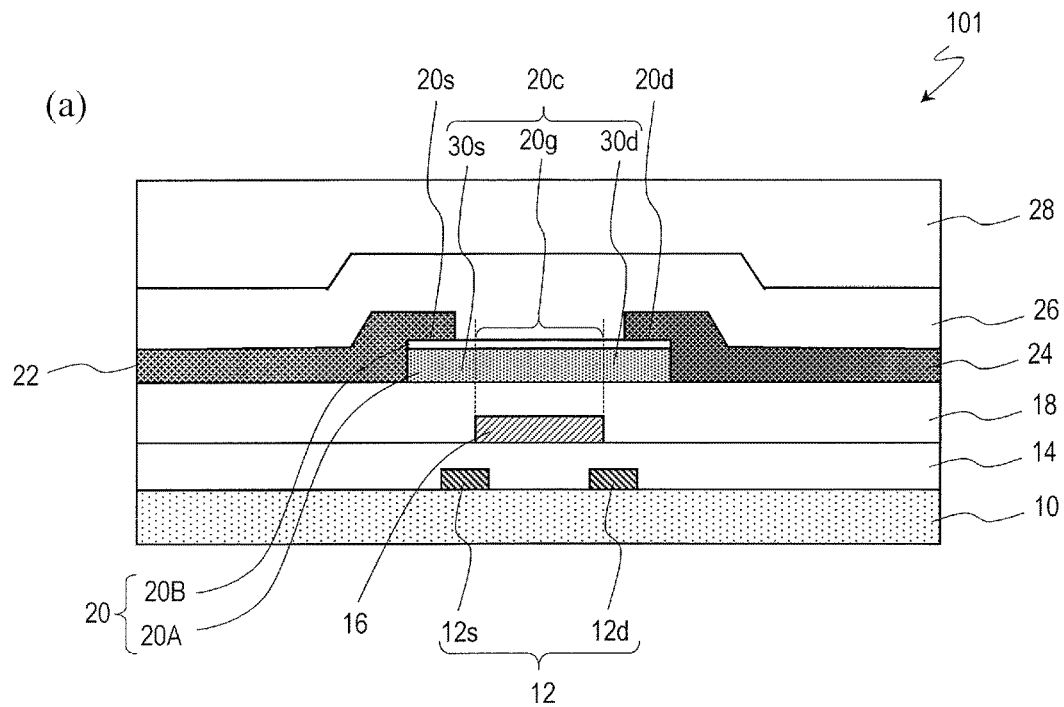
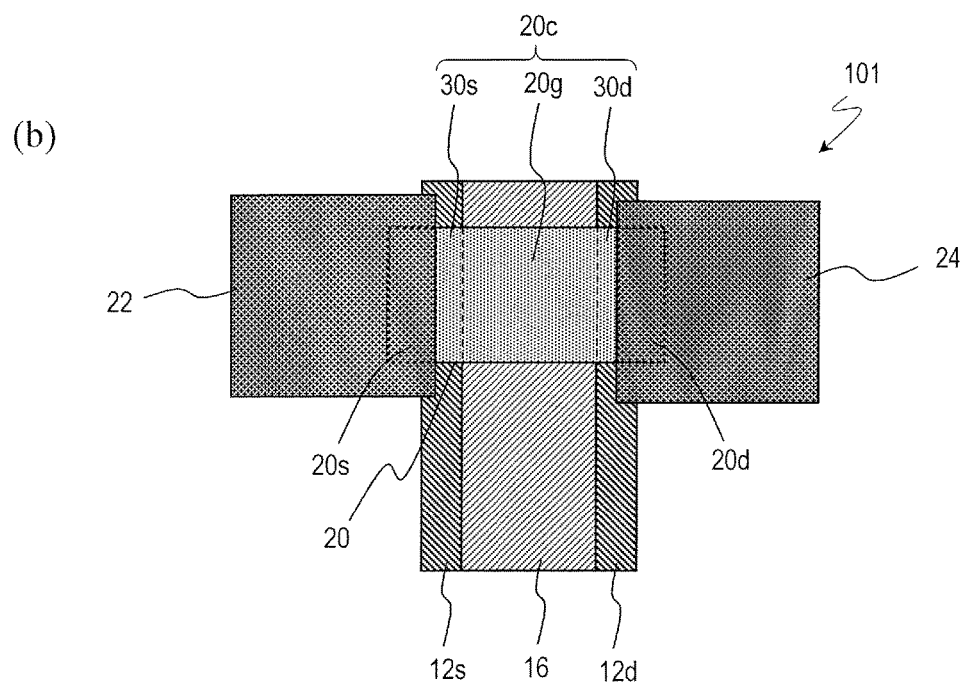

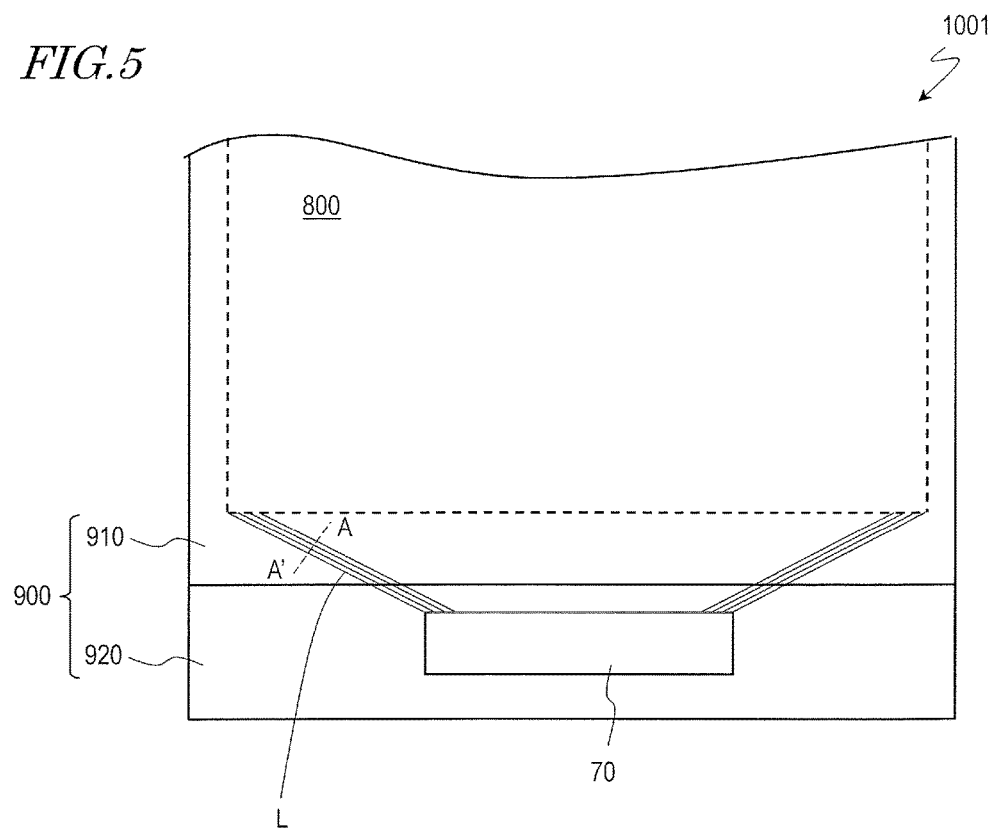
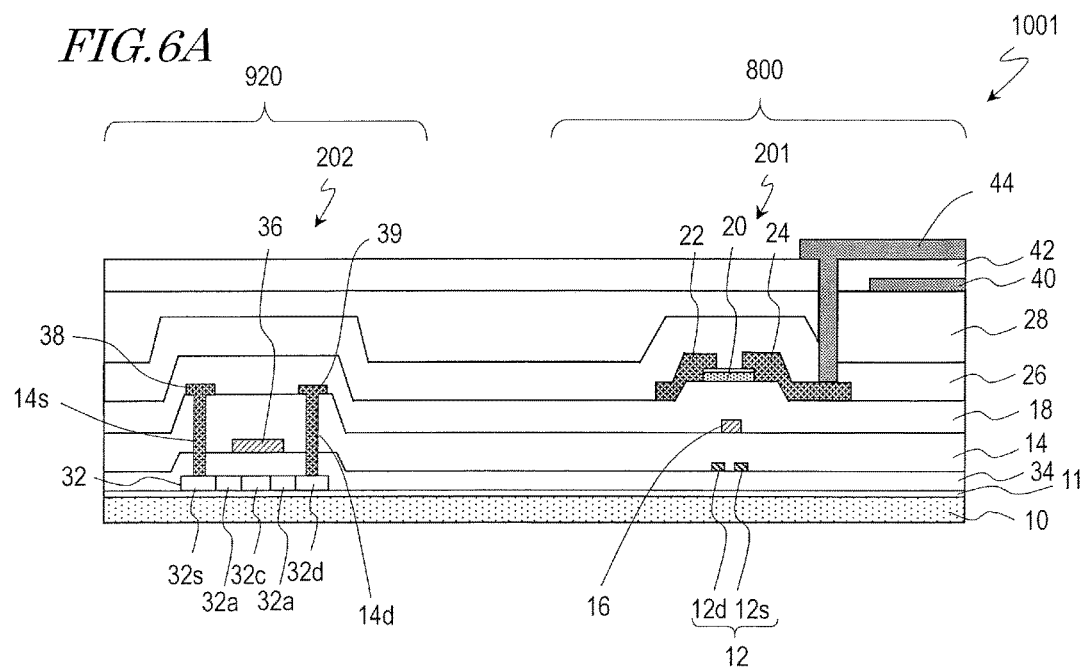

*FIG.10*
(a)
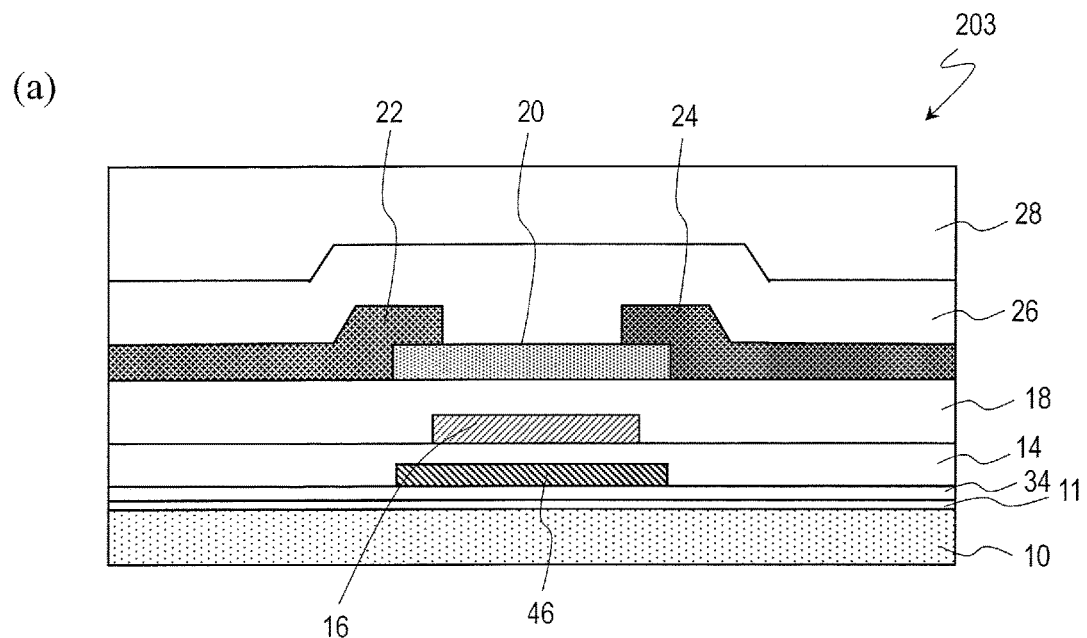
(b)
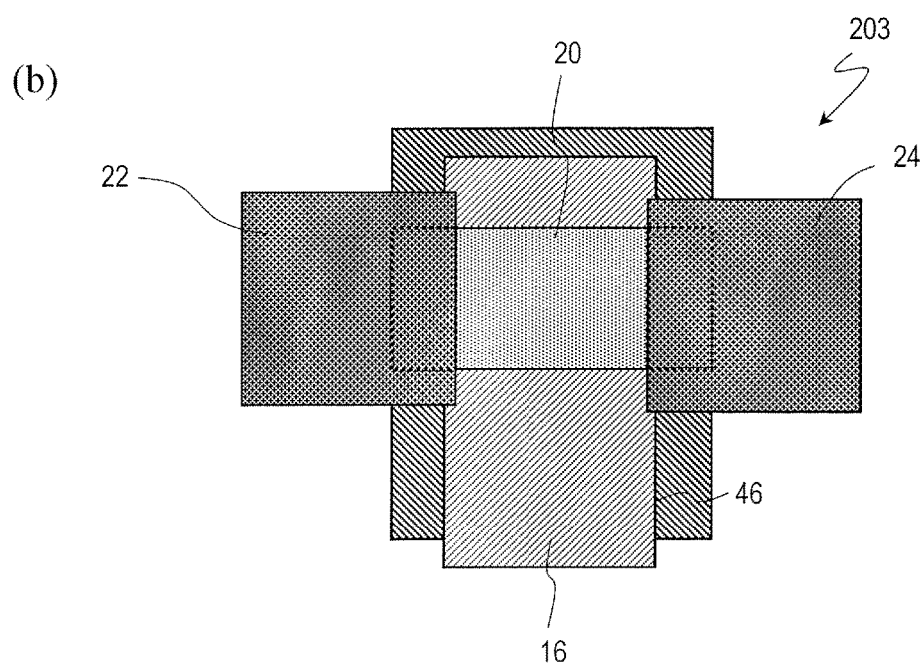

SEMICONDUCTOR DEVICE AND METHOD FOR MANUFACTURING SAME

TECHNICAL FIELD

The present invention relates to a semiconductor device and a method for manufacturing the same.

BACKGROUND ART

An active matrix substrate includes, for each pixel, a thin film transistor (hereinafter, "TFT"), for example, as a switching element. In the present specification, such a TFT is referred to as a "pixel TFT". Amorphous silicon TFTs using an amorphous silicon film as the active layer and crystalline silicon TFTs using a crystalline silicon film such as a polycrystalline silicon film as the active layer have been used widely as pixel TFTs.

A part or whole of a peripheral driving circuit may be formed integrally on the same substrate as pixel TFTs. Such an active matrix substrate is called a driver-monolithic active matrix substrate. With a driver-monolithic active matrix substrate, the peripheral driving circuit is provided in a region (a non-display region or a bezel region) other than the region (the display region) including a plurality of pixels. The pixel TFTs and TFTs of the driving circuit (driving TFTs) can be formed by using the same semiconductor film. For example, a polycrystalline silicon film having a high field effect mobility is used as the semiconductor film.

It has been proposed to use an oxide semiconductor, instead of an amorphous silicon or a polycrystalline silicon, as the material of the active layer of the TFT. It has also been proposed to use an In—Ga—Zn—O-based semiconductor, whose main components are indium, gallium, zinc and oxygen, for example, as the oxide semiconductor. Such a TFT is referred to as an "oxide semiconductor TFT". An oxide semiconductor has a higher mobility than an amorphous silicon. Therefore, an oxide semiconductor TFT is capable of operating faster than an amorphous silicon TFT. An oxide semiconductor film can be formed by a process that is simpler than that of a polycrystalline silicon film, and it can therefore be applied to devices that are required to have large surfaces.

With an oxide semiconductor TFT, if the gate electrode and the source or drain electrode overlap each other, as seen from a direction normal to the substrate, a gate-source parasitic capacitance and a gate-drain parasitic capacitance are formed in accordance with the area of overlap. If the parasitic capacitance is large, the operation speed of the oxide semiconductor TFT may lower.

In view of this, a TFT having a so-called offset structure has been proposed, in which the gate electrode and the source/drain electrode are arranged so as to be spaced apart from each other. In a TFT having an offset structure, a portion of the oxide semiconductor layer where the channel is formed (hereinafter referred to as the "channel formation region") has a region (offset region) that does not overlap the gate electrode with the gate insulating film therebetween. In a channel-etch-type TFT, an "offset region" is a region of the channel formation region of the oxide semiconductor layer that overlaps none of the source electrode, the drain electrode and the gate electrode. Note that the "channel formation region" refers to a region of the oxide semiconductor layer that is located between the source contact region connected to the source electrode and the drain contact region connected to the drain electrode.

The offset region is a region that is not opposing the gate electrode and whose resistance is not lowered by the voltage application to the gate electrode. In a TFT having an offset structure, such an offset region is arranged in the channel formation region of the oxide semiconductor layer, thereby causing a problem that the ON current lowers. Particularly, an oxide semiconductor TFT has a good OFF leak characteristic while the resistance of the oxide semiconductor layer is often high. Therefore, if the distance between the gate electrode and the drain electrode is large, a sufficient ON characteristic may not be obtained in some cases.

In contrast, Patent Document No. 1, for example, discloses providing an auxiliary gate electrode so as to correspond to the offset region for the purpose of improving the electric characteristic of an oxide semiconductor TFT having an offset structure. In a bottom-gate-type oxide semiconductor TFT disclosed in Patent Document No. 1, an auxiliary gate electrode is arranged on the protective layer covering the TFT at a position that corresponds to the offset region of the oxide semiconductor layer.

CITATION LIST

Patent Literature

Patent Document No. 1: Japanese Laid-Open Patent Publication No. 2011-82486

SUMMARY OF INVENTION

Technical Problem

A study by the present inventor revealed that a sufficient reliability may not be obtained in some cases with the TFT structure disclosed in Patent Document No. 1. The details will be described later.

An embodiment of the present invention has been made in view of the above, and it is an object thereof to provide a semiconductor device including an oxide semiconductor TFT and having good TFT characteristics and a good reliability, and a method for manufacturing the same.

Solution to Problem

A semiconductor device according to one embodiment of the present invention is a semiconductor device including a substrate and a first thin film transistor provided on the substrate, the first thin film transistor including: at least one sub-gate electrode; a first insulating layer covering the sub-gate electrode; a main gate electrode formed on the first insulating layer; a second insulating layer covering the main gate electrode; an oxide semiconductor layer arranged so as to partially overlap the main gate electrode with the second insulating layer therebetween, wherein the oxide semiconductor layer has a layered structure of a first layer and a second layer provided on the first layer, the second layer having a larger band gap than the first layer; and a first source electrode and a first drain electrode electrically connected to the oxide semiconductor layer, the oxide semiconductor layer including: a gate opposing region that overlaps the main gate electrode as seen from a direction normal to the substrate; a source contact region that is in contact with the first source electrode; a drain contact region that is in contact with the first drain electrode; and an offset region that is provided at least one of between the gate opposing region and the source contact region and between the gate opposing region and the drain contact region, wherein at least a portion of the offset region overlaps the sub-gate electrode with the first insulating layer and the second insulating layer therebetween.

In one embodiment, as seen from a direction normal to the substrate, the offset region is provided adjacent to the gate opposing region and overlaps none of the main gate electrode, the first source electrode and the first drain electrode.

In one embodiment, the offset region includes a source-side offset region that is arranged between the gate opposing region and the source contact region, and a drain-side offset region that is arranged between the gate opposing region and the drain contact region; the sub-gate electrode includes a source-side sub-gate electrode that overlaps at least a portion of the source-side offset region with the first insulating layer and the second insulating layer therebetween, and a drain-side sub-gate electrode that overlaps at least a portion of the drain-side offset region with the first insulating layer and the second insulating layer therebetween; and the source-side sub-gate electrode and the drain-side sub-gate electrode are arranged spaced apart from each other under the main gate electrode as seen from a direction normal to the substrate.

In one embodiment, as seen from a direction normal to the substrate, the sub-gate electrode overlaps either one of a first source electrode and the first drain electrode, and a portion of the sub-gate electrode that overlaps the first source electrode or the first drain electrode has a length of 0 μm or more and 1 μm or less in a channel length direction.

In one embodiment, as seen from a direction normal to the substrate, the sub-gate electrode overlaps either one of a first source electrode-side end portion or a first drain electrode-side end portion of the main gate electrode, and a portion of the sub-gate electrode that overlaps the first source electrode-side end portion or the first drain electrode-side end portion of the main gate electrode has a length of 0 μm or more and 1 μm or less in a channel length direction.

In one embodiment, the semiconductor device further includes a second thin film transistor supported on the substrate, wherein: the second thin film transistor includes: a crystalline silicon semiconductor layer primarily including a crystalline silicon; a third insulating layer covering the crystalline silicon semiconductor layer; a second gate electrode arranged on the third insulating layer so as to overlap at least a portion of the crystalline silicon semiconductor layer with the third insulating layer therebetween; and a second source electrode and a second drain electrode electrically connected to the crystalline silicon semiconductor layer, wherein the main gate electrode of the first thin film transistor and the second gate electrode of the second thin film transistor are provided in different layers.

In one embodiment, the second gate electrode of the second thin film transistor and the sub-gate electrode of the first thin film transistor are formed in the same layer; and the first insulating layer is provided to extend to over the second gate electrode of the second thin film transistor.

In one embodiment, the second source electrode and the second drain electrode of the second thin film transistor are formed in the same layer as the main gate electrode of the first thin film transistor; and the second source electrode and the second drain electrode are in contact with the crystalline silicon semiconductor layer through a contact hole formed in the first insulating layer and the third insulating layer.

In one embodiment, the second source electrode and the second drain electrode of the second thin film transistor are formed in the same layer as the first source electrode and the second source electrode of the first thin film transistor; and the second source electrode and the second drain electrode are in contact with the crystalline silicon semiconductor layer in a contact hole formed in the second insulating layer, the first insulating layer and the third insulating layer.

In one embodiment, the semiconductor device further includes a display region that includes a plurality of pixels, and a driving circuit region that is provided in a region other than the display region and includes a driving circuit; the first thin film transistor is arranged in each pixel of the display region; and the second thin film transistor forms a part of the driving circuit in the driving circuit region.

In one embodiment, the first thin film transistor has a channel-etch structure.

In one embodiment, the oxide semiconductor layer includes an In—Ga—Zn—O-based semiconductor.

In one embodiment, the oxide semiconductor layer includes a crystalline portion.

A method for manufacturing a semiconductor device in one embodiment of the present invention is a method for manufacturing a semiconductor device including a first thin film transistor that has an oxide semiconductor layer as an active layer and a second thin film transistor that has a crystalline silicon semiconductor layer as an active layer, the method including the steps of: (A) forming a crystalline silicon semiconductor layer on a substrate; (B) forming a third insulating layer on the crystalline silicon semiconductor layer; (C) forming a sub-gate conductive film on the third insulating layer and patterning the sub-gate conductive film, thereby forming a gate electrode of the second thin film transistor and a sub-gate electrode of the first thin film transistor; (D) forming a first insulating layer that covers the gate electrode of the second thin film transistor and the sub-gate electrode of the first thin film transistor, and forming a source contact hole and a drain contact hole in the third insulating layer and the first insulating layer, wherein a portion of the crystalline silicon semiconductor layer is exposed through the source contact hole and the drain contact hole; forming a main gate conductive film on the first insulating layer and in the source contact hole and the drain contact hole and patterning the main gate conductive film, thereby forming source and drain electrodes of the second thin film transistor and a main gate electrode of the first thin film transistor, wherein the source and drain electrodes of the second thin film transistor are in contact with the crystalline silicon semiconductor layer through the source contact hole and the drain contact hole, respectively; (E) forming a second insulating layer that covers the source and drain electrodes of the second thin film transistor and the main gate electrode of the first thin film transistor; (F) forming an oxide semiconductor layer on the second insulating layer so as to partially overlap the main gate electrode with the second insulating layer therebetween, wherein the oxide semiconductor layer has a layered structure of a first layer and a second layer arranged on the first layer, the second layer having a larger band gap than the first layer; and (G) forming a source electrode of the first thin film transistor so as to be in contact with a portion of the oxide semiconductor layer and forming a drain electrode of the first thin film transistor so as to be in contact with another portion of the oxide semiconductor layer, wherein where a portion of the oxide semiconductor layer that overlaps the main gate electrode is denoted as a gate opposing region, a portion thereof that is in contact with the source electrode as a source contact region and a portion thereof that is in contact with the drain electrode as a drain contact region, as seen from a direction normal to the substrate, the oxide semiconductor layer includes an offset region that is provided at least one of between the gate opposing region and the source contact region and between the gate opposing region and the drain contact region, and at least a portion of the offset region overlaps the sub-gate electrode with the first insulating layer and the second insulating layer therebetween.

A method for manufacturing a semiconductor device of another embodiment of the present invention is a method for manufacturing a semiconductor device including a first thin film transistor that has an oxide semiconductor layer as an active layer and a second thin film transistor that has a crystalline silicon semiconductor layer as an active layer, the method including the steps of: (A) forming a crystalline silicon semiconductor layer on a substrate; (B) forming a third insulating layer on the crystalline silicon semiconductor layer; (C) forming a sub-gate conductive film on the third insulating layer and patterning the sub-gate conductive film, thereby forming a gate electrode of the second thin film transistor and a sub-gate electrode of the first thin film transistor; (D) forming a first insulating layer that covers the gate electrode of the second thin film transistor and the sub-gate electrode of the first thin film transistor; forming a main gate conductive film on the first insulating layer and patterning the main gate conductive film, thereby forming a main gate electrode of the first thin film transistor; (E) forming a second insulating layer that covers the main gate electrode of the first thin film transistor; (F) forming a source contact hole and a drain contact hole in the third insulating layer, the first insulating layer and the second insulating layer, wherein a portion of the crystalline silicon semiconductor layer is exposed through the source contact hole and the drain contact hole; (G) forming an oxide semiconductor layer to be an active layer of the first thin film transistor on the second insulating layer so as to partially overlap the main gate electrode with the second insulating layer therebetween, wherein the oxide semiconductor layer has a layered structure of a first layer and a second layer arranged on the first layer, the second layer having a larger band gap than the first layer; and (H) forming a source conductive film on the second insulating layer, on the oxide semiconductor layer and in the source contact hole and in the drain contact hole and patterning the source conductive film, thereby forming a source electrode of the first thin film transistor that is in contact with a portion of the oxide semiconductor layer, a drain electrode of the first thin film transistor that is in contact with another portion of the oxide semiconductor layer, a source electrode of the second thin film transistor that is in contact with a portion of the crystalline silicon semiconductor layer through the source contact hole, and a drain electrode of the second thin film transistor that is in contact with another portion of the crystalline silicon semiconductor layer through the drain contact hole, wherein where a portion of the oxide semiconductor layer that overlaps the main gate electrode is denoted as a gate opposing region, a portion thereof that is in contact with the source electrode as a source contact region and a portion thereof that is in contact with the drain electrode as a drain contact region, as seen from a direction normal to the substrate, the oxide semiconductor layer includes an offset region that is provided at least one of between the gate opposing region and the source contact region and between the gate opposing region and the drain contact region, and at least a portion of the offset region overlaps the sub-gate electrode with the first insulating layer and the second insulating layer therebetween.

In one embodiment, the first thin film transistor has a channel-etch structure.

In one embodiment, the oxide semiconductor layer includes an In—Ga—Zn—O-based semiconductor.

In one embodiment, the oxide semiconductor layer includes a crystalline portion.

Advantageous Effects of Invention

According to an embodiment of the present invention, there is provided a semiconductor device including an oxide semiconductor TFT and having good TFT characteristics and a good reliability, and a method for manufacturing the same.

BRIEF DESCRIPTION OF DRAWINGS

FIGS. 1(a) and 1(b) are a cross-sectional view and a plan view, respectively, illustrating an oxide semiconductor TFT 101 of a semiconductor device of a first embodiment.

FIG. 5 is a schematic plan view illustrating a semiconductor device 1001 of a second embodiment.

FIG. 6A is a cross-sectional view showing an oxide semiconductor TFT 201 and a crystalline silicon TFT 202 of the semiconductor device 1001.

FIGS. 10(a) and 10(b) are a cross-sectional view and a plan view, respectively, illustrating an oxide semiconductor TFT 203 that does not have the offset structure.

DESCRIPTION OF EMBODIMENTS

As a result of an in-depth study by the present inventor, it was found that conventional oxide semiconductor TFTs having an offset structure can have the following problem. This will be described below with reference to the drawings.

Figure 13:
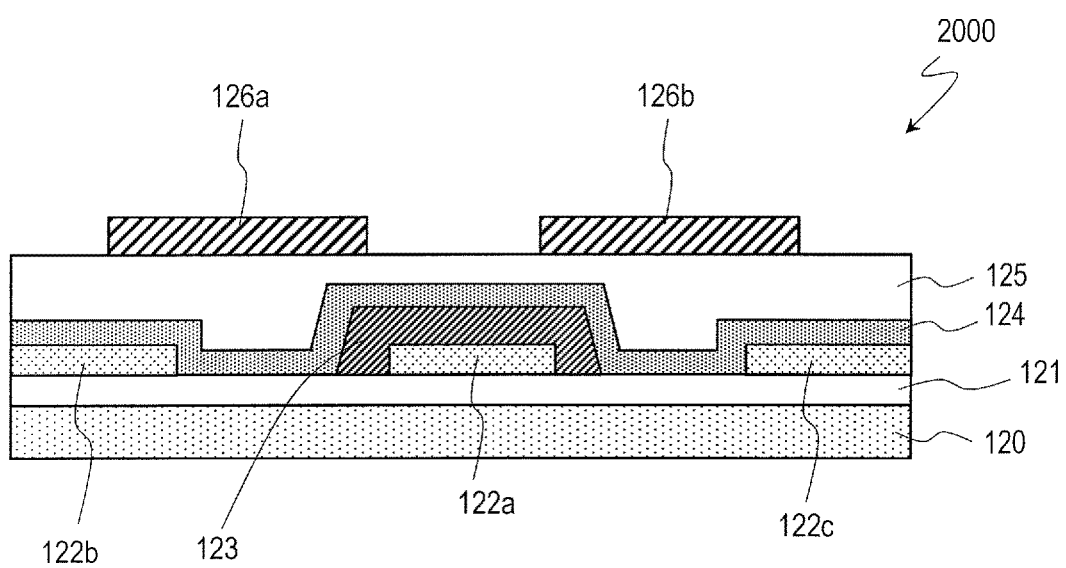
FIG. 13 is a cross-sectional view showing a conventional oxide semiconductor TFT 2000.

FIG. 13 is a cross-sectional view showing a bottom-gate-type oxide semiconductor TFT 2000 disclosed in Patent Document No. 1.

The oxide semiconductor TFT 2000 includes a substrate 120, a source electrode 122b and a drain electrode 122c formed on the substrate 120, a gate electrode 122a formed between the source electrode 122b and the drain electrode 122c, a gate insulating film 123 covering the gate electrode 122a, an oxide semiconductor layer 124 formed on the gate insulating film 123 so as to be in contact with the source electrode 122b and the drain electrode 122c, a protective layer 125 covering the oxide semiconductor layer 124, and auxiliary gate electrodes 126a and 126b provided on the protective layer 125. The auxiliary gate electrode 126a is arranged so as to correspond to an offset region of the oxide semiconductor layer 124 that is located between the source electrode 122b and the gate electrode 122a. Similarly, the auxiliary gate electrode 126b is arranged so as to correspond to an offset region that is located between the drain electrode 122c and the gate electrode 122a.

With the TFT structure disclosed in Patent Document No. 1, the auxiliary gate electrodes 126a and 126b are arranged on the side (the back channel side) that is opposite to the gate electrode 122a with the oxide semiconductor layer 124 therebetween.

On the other hand, in recent years, it has been proposed to use an oxide semiconductor layer having a layered structure as the oxide semiconductor layer (Japanese Laid-Open Patent Publication No. 2013-038399, Japanese Laid-Open Patent Publication No. 2014-033194, etc.). For example, a layered semiconductor layer including a first layer on the gate insulating film and a second layer having a greater energy gap than the first layer, which are layered in this order, may be used as the oxide semiconductor layer of a bottom gate structure TFT. With this TFT, the channel is formed in the first layer having a smaller band gap. Since a current is unlikely to flow in the second layer, which is on the back channel side, it is possible to reduce the deterioration of the characteristics of the TFT due to an electron trap, or the like. Moreover, with a TFT having a channel-etch structure, in the source-drain separation step, the second layer can be made to function as a buffer layer so as to reduce the damage to the first layer, which is the channel formation region.

With the TFT 2000 disclosed in Patent Document No. 1, if a layered semiconductor layer as described above is used as the oxide semiconductor layer 124, a current flows to the back channel side (the second layer side) of the layered semiconductor layer due to the auxiliary gate electrodes arranged on the back channel side. As a result, the TFT characteristics may deteriorate and the hysteresis may increase.

With the TFT structure of Patent Document No. 1, the protective layer 125 of the oxide semiconductor TFT 2000 serves as the gate insulating film for the auxiliary gate electrodes (hereinafter, the "auxiliary gate insulating film"). Therefore, it is difficult to optimize the conditions for the auxiliary gate insulating film. For example, it may not be possible to make the auxiliary gate insulating film sufficiently thin to improve the ON characteristic of the TFT. Moreover, it may not be possible to use an insulating film having optimal properties as the auxiliary gate insulating film. Typically, an insulating film having a low hydrogen content is used as the gate insulating film of an oxide semiconductor TFT. This is because if an impurity such as moisture is diffused into the oxide semiconductor layer, an impurity level may be formed and the carrier concentration may become high, thereby altering the TFT characteristics and lowering the reliability. However, for example, an insulating film that is suitable as the protective layer 125, which is the flattening film, may not have properties that are required for the auxiliary gate insulating film (e.g., a low hydrogen content). Thus, it may not be possible to select the conditions of the auxiliary gate insulating film with a high degree of freedom, and as a result, the reliability of the TFT may become low.

Based on the above findings, the present inventor has arrived at the present invention by discovering a structure of a TFT that includes, as the active layer, an oxide semiconductor layer having a layered structure, and that has an offset structure, wherein it is possible to enhance the ON characteristic while ensuring the reliability.

First Embodiment

A first embodiment of a semiconductor device of the present invention will now be described. The semiconductor device of the present embodiment includes an oxide semiconductor TFT (hereinafter referred to simply as a "TFT"). The semiconductor device of the present embodiment may be any device that includes at least one TFT on the substrate, and generally includes circuit substrates such as active matrix substrates, various display devices such as liquid crystal display devices and organic EL display devices, image sensors, electronic appliances, etc.

Each TFT of the semiconductor device of the present embodiment has an offset structure. Also, it includes two different gate electrodes arranged in different layers from each other so as to oppose the oxide semiconductor layer. In the present specification, one of these gate electrodes that is provided in a layer closer to the oxide semiconductor layer (i.e., one for which the thickness of the gate insulating film is smaller) is referred to as a "main gate electrode", and the other gate electrode that is provided in a layer farther away from the oxide semiconductor layer (i.e., one for which the thickness of the gate insulating film is larger) is referred to as a "sub-gate electrode".

When the semiconductor device of the present embodiment is an active matrix substrate, the main gate electrode is connected to a gate bus line, for example. The main gate electrode may be provided in the same layer as the gate bus line. The sub-gate electrode is provided in a layer different from the gate bus line. The sub-gate electrode may be electrically connected to the gate bus line. For example, there may be provided a connecting portion that electrically connects the sub-gate electrode with the gate electrode or the gate bus line (or the main gate electrode).

FIGS. 1(*a*) and 1(*b*) are a cross-sectional view and a plan view, respectively, showing a TFT 101 of a semiconductor device of the present embodiment. Note that although only one TFT 101 is shown in FIGS. 1(*a*) and 1(*b*), a plurality of TFTs may be provided on a substrate.

The TFT 101 is a TFT having a channel-etch structure. The TFT 101 includes sub-gate electrodes 12s and 12d provided on a substrate 10, a first insulating layer 14 covering the sub-gate electrodes 12s and 12d, a main gate electrode 16 provided on the first insulating layer 14, a second insulating layer 18 covering the main gate electrode 16, and a typically island-shaped oxide semiconductor layer 20 provided on the second insulating layer 18. The oxide semiconductor layer 20 is a layer that primarily includes an oxide semiconductor. In the present specification, an "oxide semiconductor layer 20" also includes cases where a portion thereof is reduced by contacting a metal layer, for example, to become a resistance-lowered region (or a conductor region).

The second insulating layer 18 is arranged between the main gate electrode 16 and the oxide semiconductor layer 20, and functions as a gate insulating layer for the main gate electrode (hereinafter referred to as the "main gate insulating layer"). On the other hand, the first insulating layer 14 and the second insulating layer 18 are arranged between the sub-gate electrodes 12s and 12d and the oxide semiconductor layer 20, and these insulating layers function as the gate insulating layer for the sub-gate electrodes (hereinafter referred to as the "sub-gate insulating layer").

As seen from the direction normal to the substrate 10, the oxide semiconductor layer 20 includes a gate opposing region 20g, which is a region that overlaps the main gate electrode 16, with a source electrode 22 and a drain electrode 24 connected respectively to the opposite outer sides (on the source side and the drain side) of the gate opposing region 20g. The source electrode 22 and the drain electrode 24 are provided so as to be spaced apart from the main gate electrode 16 as seen from the direction normal to the substrate. Herein, a region of the oxide semiconductor layer 20 that overlaps (is in contact with) the source electrode 22 is referred to as a source contact region 20s, and a region thereof that overlaps (is in contact with) the drain electrode 24 is referred to as a drain contact region 20d.

In the oxide semiconductor layer 20, a region 30s is formed between the gate opposing region 20g and the source contact region 20s that overlaps neither the main gate electrode 16 nor the source electrode 22. A region 30d is formed between the gate opposing region 20g and the drain contact region 20d that overlaps neither the gate electrode 16 nor the drain electrode 24. Hereinafter, these regions may be referred to as the source-side offset region 30s and the drain-side offset region 30d (collectively, the offset region 30). In the present specification, a region 20c of the oxide semiconductor layer 20 that is located between the source electrode 22 (the source contact region 20s) and the drain electrode 24 (the drain contact region 20d) and where the channel is formed is referred to as the channel formation region. In this example, the channel formation region includes the gate opposing region 20g and the offset region 30.

At least a portion of the source-side offset region 30s overlaps the sub-gate electrode 12s as seen from the direction normal to the substrate 10. At least a portion of the drain-side offset region 30d overlaps a sub-gate electrode 12d as seen from the direction normal to the substrate 10. Hereinafter, the sub-gate electrodes 12s and 12d are referred to respectively as the source-side sub-gate electrode 12s and the drain-side sub-gate electrode 12d (collectively, the sub-gate electrode 12). In the example shown in FIG. 1, the source-side sub-gate electrode 12s and the drain-side sub-gate electrode 12d are arranged spaced apart from each other under the main gate electrode 16. Note that the source-side sub-gate electrode 12s and the drain-side sub-gate electrode 12d may be electrically connected to each other.

The oxide semiconductor layer 20 of the present embodiment has a layered structure. Herein, the oxide semiconductor layer 20 includes a first layer 20A in contact with the second insulating layer 18 and a second layer 20B stacked on the first layer 20A. The channel of the TFT 101 may be formed in the first layer 20A. The first layer 20A may have a smaller band gap than the second layer 20B. The first layer 20A may be thicker than the second layer 20B. Note that the oxide semiconductor layer 20 is not limited to a 2-layer structure, but may have a layered structure of three layers or more. For example, a third layer may be further provided on the substrate 10 side of the first layer 20A. In this case, the channel is formed in the first layer 20A if the band gap of the first layer 20A is smaller than the second layer 20B and the third layer.

The oxide semiconductor layer 20, the source electrode 22 and the drain electrode 24 are covered with a protective layer (passivation film) 26. An upper insulating layer 28 may be further provided on the protective layer 26. The upper insulating layer 28 may be a flattening film.

At least the gate opposing region 20g and the offset region 30 of the oxide semiconductor layer 20 may have substantially the same carrier concentration. Note that depending on the metal material used as the source electrode 22 and the drain electrode 24, the carrier concentration of the offset region 30 may become higher. This is because hydrogen diffused from the source electrode 22 or the drain electrode 24 causes a reducing process in the offset region 30. Note however that the present specification may use the expression "have substantially the same carrier concentration" for regions that are formed from the same oxide semiconductor film and subjected to similar carrier concentration control processes, including cases where the carrier concentration of the offset region 30 is not completely uniform.

According to the present embodiment, since the main gate electrode 16 is at a distance from the source electrode 22 and the drain electrode 24 (offset structure) as seen from the direction normal to the substrate 10, it is possible to reduce the source-gate parasitic capacitance and the drain-gate parasitic capacitance. Therefore, it is possible to increase the operation speed of the TFT 101.

In the present embodiment, by applying a predetermined voltage to the main gate electrode 16, it is possible, in the gate opposing region 20g, to reduce the resistance in the vicinity of the surface of the first layer 20A of the oxide semiconductor layer 20. The sub-gate electrodes 12s and 12d are provided on the same side as the main gate electrode 16 with respect to the oxide semiconductor layer 20, i.e., on the substrate 10 side of the oxide semiconductor layer 20. Therefore, by applying a predetermined voltage to the sub-gate electrode 12, it is possible, also in the offset region 30, to reduce the resistance in the vicinity of the surface of the first layer 20A of the oxide semiconductor layer 20. Therefore, it is possible to reduce the ON resistance as compared with a case in which only the main gate electrode 16 is provided.

Moreover, with the semiconductor device of the present embodiment, the conditions such as the thickness and the material of the first insulating layer 14 and the second insulating layer 18, which function as gate insulating layers, can be optimized independently of other layers such as the protective layer 26. Specifically, an insulating film having a low water content can be used as the first insulating layer 14 and the second insulating layer 18, and it is therefore possible to enhance the reliability of the TFT 101. As compared with a case in which the protective layer is made to function as the sub-gate insulating layer (Patent Document No. 1), for example, the sub-gate insulating layer can be made thinner, and it is therefore possible to more effectively enhance the ON characteristic of the TFT 101.

With a conventional bottom-gate-type TFT having an offset structure (e.g., the TFT 2000 shown in FIG. 13), the TFT characteristics may deteriorate as light from the backlight enters the offset region of the oxide semiconductor layer from the substrate side. In order to prevent this, it is necessary to separately provide a light blocking layer. In contrast, in the present embodiment, it is possible, with the sub-gate electrode 12, to prevent light from the backlight from entering the offset region 30 of the oxide semiconductor layer 20, and it is therefore possible to reduce the deterioration of the TFT characteristics. Therefore, there is no need to separately provide a light blocking layer for stabilizing the TFT characteristics.

Although the offset regions 30s and 30d and the sub-gate electrodes 12s and 12d are arranged both on the source side and on the drain side of the gate opposing region 20g in the example shown in FIG. 1, they may be arranged only on one side. For example, an offset region and a sub-gate electrode may be arranged only on the drain side.

Although the sub-gate electrodes 12s and 12d are provided respectively for the offset regions 30s and 30d in the example shown in FIG. 1, there may be a sub-gate electrode arranged only for one of the offset regions. As seen from the direction normal to the substrate 10, each sub-gate electrode 12 is only required to at least partially overlap the corresponding offset region 30. Note however that the ON characteristic can be improved more effectively if each sub-gate electrode 12 overlaps the entirety of the corresponding offset region 30.

As seen from the direction normal to the substrate 10, the sub-gate electrodes 12s and 12d may partially overlap the main gate electrode 16. The source-side sub-gate electrode 12s may partially overlap the source electrode 22, and the drain-side sub-gate electrode 12d may partially overlap the drain electrode 24.

Figure 2:
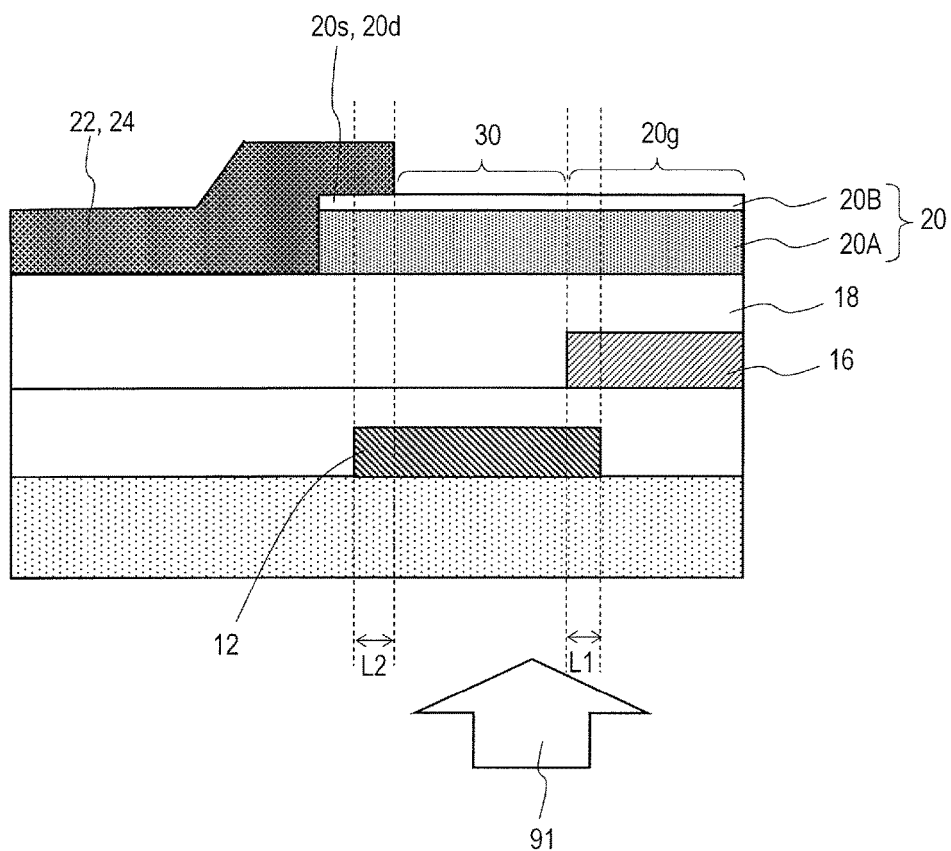
FIG. 2 is an enlarged view of a portion of the oxide semiconductor TFT 101.

FIG. 2 is an enlarged cross-sectional view showing a portion of the TFT 101.

As seen from the direction normal to the substrate 10, an end portion of the sub-gate electrode 12 that is on the main gate electrode 16 side may overlap the main gate electrode 16, and the other end portion thereof may overlap the source electrode 22 or the drain electrode 24. Then, the sub-gate electrode 12 can be more reliably arranged so as to overlap the entirety of the corresponding offset region 30. Therefore, it is possible to further reduce the resistance of the offset region 30, and it is therefore possible to further enhance the ON current. It is also possible to more effectively reduce the deterioration of the TFT characteristics, which occurs because light 91 from the backlight enters the offset region 30 from the reverse side of the substrate 10.

While there is no particular limitation on the channel length of the TFT 101, it may be 2 µm or more and 20 µm or less, for example. In this case, the width of the offset region 30 in the channel length direction may be smaller than the channel length, e.g., 0.5 µm or more and 2 µm or less.

The width (overlapping length) L2 in the channel length direction of a portion where the sub-gate electrode 12 overlaps the source electrode 22 or the drain electrode 24 is 0 µm or more and 1 µm or less, for example. If it is 0 µm or more, it is possible to further reduce the resistance of the offset region 30 as described above. If it is 1 µm or less, it is possible to reduce the parasitic capacitance to be formed because the source electrode 22 or the drain electrode 24 overlaps the sub-gate electrode 12.

The width (overlapping length) L1 in the channel length direction of a portion where the sub-gate electrode 12 overlaps the main gate electrode 16 is 0 µm or more and 1 µm or less, for example. If it is 0 µm or more, it is possible to more effectively block the light 91 from the backlight entering the oxide semiconductor layer 20 as described above. If it is 1 µm or less, it is possible to reduce the parasitic capacitance to be formed because the main gate electrode 16 overlaps the sub-gate electrode 12.

Note that the sub-gate electrode 12 may not be divided under the main gate electrode 16. For example, there may be arranged one sub-gate electrode 12 extending so as to overlap both the source-side offset region 30s and the drain-side offset region 30d. Note however that the sub-gate electrode 12 preferably is divided or has an opening under the main gate electrode 16. Then, at least a portion of the main gate electrode 16 does not overlap the sub-gate electrode 12, and it is therefore possible to reduce the overlapping capacitance between the sub-gate electrode 12 and the main gate electrode 16.

The oxide semiconductor included in the oxide semiconductor layer 20 may be an amorphous oxide semiconductor or a crystalline oxide semiconductor having a crystalline portion. Examples of the crystalline oxide semiconductor include a polycrystalline oxide semiconductor, a microcrystalline oxide semiconductor, a crystalline oxide semiconductor whose c-axis is oriented generally vertical to the layer surface, etc.

In the present embodiment, the oxide semiconductor layer 20 has a layered structure of two or more layers having different band gaps. When the oxide semiconductor layer 20 has a layered structure, the oxide semiconductor layer 20 may include an amorphous oxide semiconductor layer and a crystalline oxide semiconductor layer. Alternatively, it may include a plurality of crystalline oxide semiconductor layers having different crystalline structures. Alternatively, it may include a plurality of amorphous oxide semiconductor layers. When the oxide semiconductor layer 20 has a 2-layer structure including an upper layer and a lower layer, the energy gap of the oxide semiconductor included in the upper layer is preferably greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer. An oxide semiconductor layer having a layered structure is disclosed in Japanese Laid-Open Patent Publication No. 2013-038399 and Japanese Laid-Open Patent Publication No. 2014-033194, for example. The entire disclosures of Japanese Laid-Open Patent Publication No. 2013-038399 and Japanese Laid-Open Patent Publication No. 2014-033194 are herein incorporated by reference.

The material, the structure and the deposition method of the amorphous oxide semiconductor, those of the crystalline oxide semiconductors described above, and the structure of the oxide semiconductor layer having a layered structure, etc., are described in Japanese Laid-Open Patent Publication No. 2014-007399, for example. The entire disclosure of Japanese Laid-Open Patent Publication No. 2014-007399 is herein incorporated by reference.

The oxide semiconductor layer 20 may include at least one metal element from among In, Ga and Zn, for example. In the present embodiment, the oxide semiconductor layer 20 includes an In—Ga—Zn—O-based semiconductor (e.g., indium gallium zinc oxide), for example. Herein, the In—Ga—Zn—O-based semiconductor is a ternary oxide of In (indium), Ga (gallium) and Zn (zinc), and there is no particular limitation on the ratio (composition ratio) between In, Ga and Zn, e.g., In:Ga:Zn=2:2:1, In:Ga:Zn=1:1:1, In:Ga:Zn=1:1:2, etc. Such an oxide semiconductor layer 20 may be formed from an oxide semiconductor film including an In—Ga—Zn—O-based semiconductor. Note that a channel-etch-type TFT having an active layer including an oxide semiconductor, such as an In—Ga—Zn—O-based semiconductor, may be referred to as a "CE-OS-TFT".

The In—Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally vertical to the layer surface, etc.

Note that the crystalline structure of the crystalline In—Ga—Zn—O-based semiconductor is disclosed for example in Japanese Laid-Open Patent Publication No. 2014-007399, Japanese Laid-Open Patent Publication No. 2012-134475, Japanese Laid-Open Patent Publication No. 2014-209727, etc., mentioned above. The entire disclosures of Japanese Laid-Open Patent Publication No. 2012-134475 and Japanese Laid-Open Patent Publication No. 2014-209727 are herein incorporated by reference. A TFT including an In—Ga—Zn—O-based semiconductor layer, which has a high mobility (greater than 20 times that of an a-Si TFT) and a lower leak current (less than 1/100 that of an a-Si TFT), can suitably be used as a driver TFT (e.g., a TFT included in the driving circuit that is provided on the same substrate as the display region around the display region including a plurality of pixels) and a pixel TFT (a TFT provided in each pixel).

The oxide semiconductor layer 20 may include any other oxide semiconductor instead of an In—Ga—Zn—O-based semiconductor. For example, it may include an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin) and Zn (zinc). Alternatively, the oxide semiconductor layer 20 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc.

The TFT 101 illustrated in FIG. 1 is a channel-etch-type TFT. In a channel-etch-type TFT, there is no etch-stop layer over the channel region, as shown in FIG. 1, for example, and the lower surfaces of the channel-side end portions of the source and drain electrodes 22 and 24 are arranged so as to be in contact with the upper surface of the oxide semiconductor layer 20. A channel-etch-type TFT is formed for example by forming a source-drain electrode conductive film on an oxide semiconductor layer, and performing a source-drain separation. In the source-drain separation step, the surface portion of the channel region may be etched.

The TFT of the present embodiment does not need to be of a channel-etch type. For example, it may have an etch-stop structure having an etch stop covering the channel region. For example, an oxygen-containing insulating layer such as an $SiO_2$ layer may be used as the etch-stop layer. In a TFT having an etch-stop structure, the channel-side end portions of the source-drain electrodes are located over the etch-stop layer, for example. An etch-stop-type TFT is formed for example by forming an etch-stop layer covering a portion of the upper surface of a semiconductor layer that is to be the channel region, then forming a source-drain electrode conductive film over the semiconductor layer and the etch-stop layer, and performing a source-drain separation.

The TFT of the present embodiment may have a top contact structure in which the source-drain electrodes are in contact with the upper surface of the semiconductor layer, or may have a bottom contact structure in which they are in contact with the lower surface of the semiconductor layer.

<Method for Manufacturing TFT 101>

Next, a method for manufacturing the TFT 101 will be described.

FIGS. 3(a) to 3(e) and FIGS. 4(a) to 4(c) are process cross-sectional views illustrating an example of a method for manufacturing the TFT 101.

Figure 3:
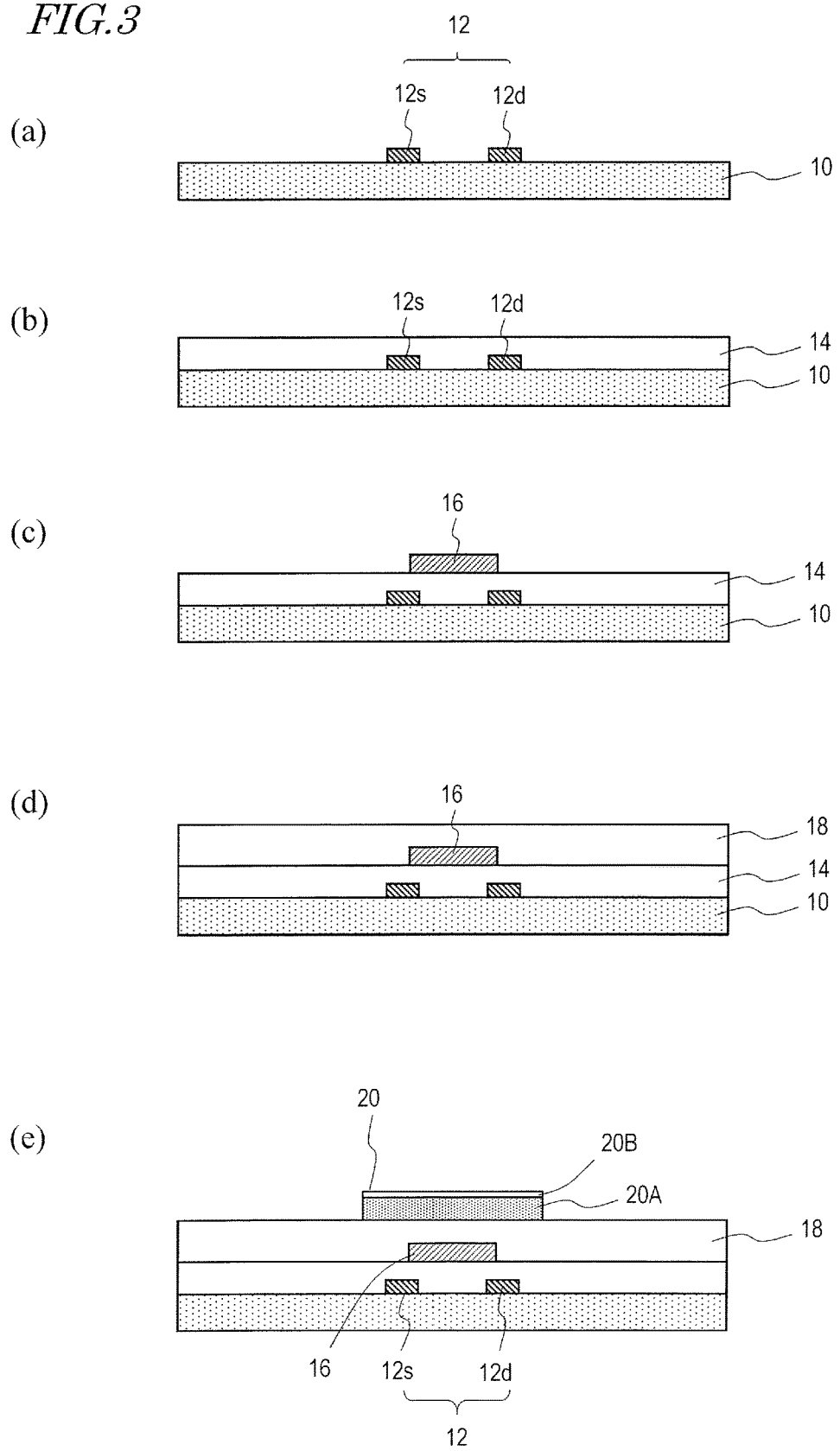
FIGS. 3(a) to 3(e) are process cross-sectional views illustrating an exemplary method for manufacturing the oxide semiconductor TFT 101.

First, as shown in FIG. 3(a), a sub-gate conductive film is formed on the transparent insulating substrate 10 such as a glass substrate or a plastic substrate. Then, the sub-gate conductive film is patterned to obtain the sub-gate electrodes 12s and 12d.

The sub-gate conductive film may suitably be a film including a metal such as aluminum (Al), tungsten (W), molybdenum (Mo), tantalum (Ta), chromium (Cr), titanium (Ti) and copper (Cu), or an alloy thereof. The thickness of the sub-gate conductive film is 100 nm to 500 nm, for example. The sub-gate conductive film may be a single layer or may be a layered film. Herein, a layered film including a Ti film, an Al film and a Ti film stacked in this order starting from the substrate 10 side is used.

Next, as shown in FIG. 3(b), the first insulating layer 14 is formed so as to cover the sub-gate electrodes 12s and 12s. The first insulating layer 14 may suitably be a silicon oxide (SiOx) film, a silicon nitride (SiNx) film, a silicon oxide nitride (SiOxNy; x>y) film, a silicon nitride oxide (SiNxOy; x>y) film, or the like, for example. The first insulating layer 14 is manufactured by using a plasma CVD apparatus, for example. The thickness of the first insulating layer 14 is 50 nm or more and 200 nm or less, for example.

Then, as shown in FIG. 3(c), a main gate conductive film is formed on the first insulating layer 14 and is patterned to obtain the main gate electrode 16. The material and the thickness of the main gate conductive film may be similar to those of the sub-gate conductive film described above. Herein, a layered film including a Ti film, an Al film and a Ti film stacked in this order starting from the substrate 10 side is used.

Next, as shown in FIG. 3(d), the second insulating layer 18 is formed so as to cover the main gate electrode 16. The second insulating layer 18 may be a silicon oxide (SiOx) film, a silicon nitride (SiNx) film or a layered film thereof, for example. The thickness of the second insulating layer 18 is 200 nm or more and 500 nm or less, for example. The second insulating layer 18 is manufactured by using a plasma CVD apparatus, for example. Herein, the second insulating layer 18 is a layered film whose lower layer is an $SiO_2$ film (thickness: 50 nm, for example) and whose upper layer is an SiNx film (thickness: 300 nm, for example).

Note that the thickness of the second insulating layer 18 is equal to the thickness of the gate insulating layer for the main gate electrode (the main gate insulating layer). On the other hand, the thickness of the gate insulating layer for the sub-gate electrode (the sub-gate insulating layer) is equal to the total thickness of the first insulating layer 14 and the second insulating layer 18, e.g., 250 nm or more and 700 nm or less.

Then, as shown in FIG. 3(e), an oxide semiconductor film is formed on the second insulating layer 18 by a sputtering method, for example, and is patterned to obtain an island-shaped oxide semiconductor layer 20. The oxide semiconductor layer 20 is arranged so that the oxide semiconductor layer 20 partially overlaps the main gate electrode 16 with the second insulating layer 18 therebetween, and the portion of the oxide semiconductor layer 20 that does not overlap the main gate electrode 16 at least partly overlaps the sub-gate electrode 12 with the first and second insulating layers 14 and 18 therebetween.

The oxide semiconductor film may be a layered film including the first layer 20A and the second layer 20B stacked in this order starting from the substrate 10 side. Each of the first layer 20A and the second layer 20B may be an In—Ga—Zn—O-based semiconductor film, for example, or may be any of various other oxide semiconductor films. Herein, as an example, an In—Ga—Zn—O-based semiconductor film (thickness: 30 nm or more and 100 nm or less, for example) is formed as the first layer 20A, and an In—Ga—Zn—O-based semiconductor film (thickness: 10 nm or more and 50 nm or less, for example) having a different composition ratio from that of the first layer 20A is formed as the second layer 20B. While there is no particular limitation on the composition ratios of the layers, they are set so that the first layer 20A, which is the lower layer, has a smaller band gap than the second layer 20B.

Figure 4:
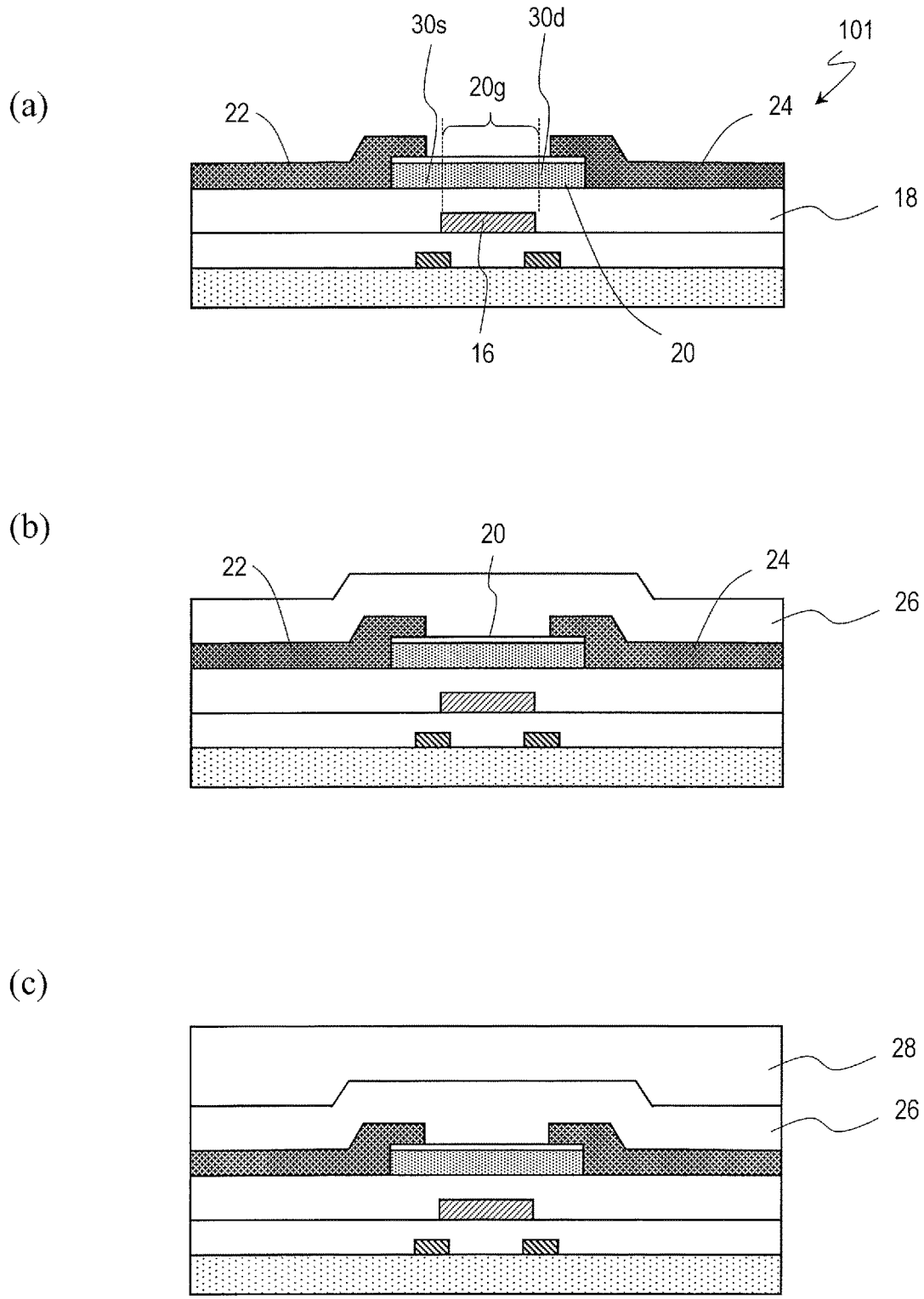
FIGS. 4(a) to 4(c) are process cross-sectional views illustrating the exemplary method for manufacturing the oxide semiconductor TFT 101.

Then, as shown in FIG. 4(a), a source conductive film for forming source-drain electrodes is formed so as to cover the oxide semiconductor layer 20, and the source conductive film is patterned to obtain the source electrode 22 and the drain electrode 24 (the source-drain separation).

The source conductive film may suitably be a film including a metal such as aluminum (Al), tungsten (W), molybdenum (Mo), tantalum (Ta), chromium (Cr), titanium (Ti) and copper (Cu), or an alloy thereof. The thickness of the source conductive film is 100 nm to 500 nm, for example. The source conductive film may be a single-layer film or a layered film. Herein, a layered film including a Ti film, an Al film and a Ti film stacked in this order starting from the substrate 10 side is used.

In the patterning step described above, the source electrode 22 and the drain electrode 24 are each formed so as to be in contact with a portion (end portion) of a region of the oxide semiconductor layer 20 that does not overlap the main gate electrode 16. The source electrode 22 and the drain electrode 24 are provided at a predetermined distance from the main gate electrode 16. In this configuration, the source-side offset region 30s that overlaps neither the main gate electrode 16 nor the source electrode 22 and the drain-side offset region 30d that overlaps neither the main gate electrode 16 nor the drain electrode 24 are formed on opposite sides of the gate opposing region 20g of the oxide semiconductor layer 20 that overlaps the main gate electrode 16. Thus, the TFT 101 using the oxide semiconductor layer 20 as the active layer is produced.

Then, as shown in FIG. 4(b), the protective layer (passivation film) 26 is provided so as to cover the TFT 101. The thickness of the protective layer 26 is 200 nm or more and 500 nm or less, for example. The protective layer 26 may be a silicon oxide film ($SiO_2$), a silicon nitride film ($SiN_x$) or a layered film thereof, for example. When a layered film is used, it is possible to prevent oxygen deficiency in the oxide semiconductor layer 20 by arranging an $SiO_2$ film on the lower surface side to be in contact with the oxide semiconductor layer 20. Thereafter, in order to stabilize the characteristics of the TFT 101 (e.g., the threshold voltage Vth), a heat treatment step may be performed for one to two hours at a temperature of 200° C. to 400° C., for example, in a dry air or the atmospheric air.

Then, as shown in FIG. 4(c), the upper insulating layer 28 is provided on the protective layer 26. The upper insulating layer 28 may be a flattening film, for example. The upper insulating layer 28 is formed by coating, for example, on the protective layer 26. The upper insulating layer 28 may be an organic insulating layer or an acrylic transparent resin layer having a positive-type photosensitivity, for example. Thus, the semiconductor device of the present embodiment is manufactured.

Second Embodiment

A second embodiment of a semiconductor device of the present invention will now be described. The semiconductor device of the present embodiment only needs to include an oxide semiconductor TFT and a crystalline silicon TFT formed on the same substrate, and examples thereof generally include circuit substrates such as active matrix substrates, various display devices such as liquid crystal display devices and organic EL display devices, image sensors, electronic appliances, etc. Herein, an active matrix substrate will be described as an example. An active matrix substrate is used in a liquid crystal display device that produces display in a VA (Vertical Alignment) mode, for example. Alternatively, it is used in a liquid crystal display device that produces display in a transverse electric field mode such as IPS (In-Plane Switching) or FFS (Fringe Field Switching). Moreover, it may be used in an organic EL display device including selection transistors.

FIG. 5 is a schematic plan view illustrating a semiconductor device (active matrix substrate) 1001 of the present embodiment.

The semiconductor device 1001 includes a display region (or an active area) 800, and a non-display region 900 located around the display region 800.

A plurality of pixel regions arranged in a matrix pattern, a plurality of gate lines extending in the first direction, and a plurality of source lines extending in the second direction are provided in the display region 800. A "pixel region" as used herein is a region that corresponds to a pixel of the display device.

A driving circuit 70 such as a source driver circuit and a gate driver circuit, a terminal section for connecting signal lines such as source bus lines and gate bus lines to the driving circuit 70, etc., are provided in the non-display region 900. In the present specification, a region 910 where the driving circuit 70 and the terminal section are provided is referred to as the "driving circuit region". A region 920 arranged between the display region 800 and the driving circuit region 920 and including a plurality of lines L extending from the display region 800 to the driving circuit region 920 is referred to as the "wiring region".

In the present embodiment, an oxide semiconductor TFT having an offset structure is used as a pixel TFT arranged in each pixel region of the display region 800. A crystalline silicon TFT is used as a driving TFT of the driving circuit 70 in the driving circuit region 920.

Figure 6B:
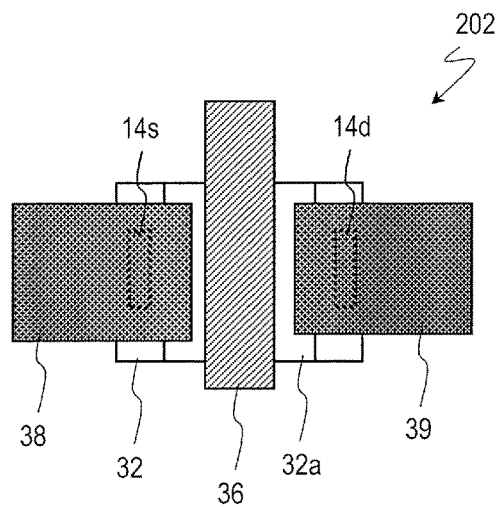
FIG. 6B is a plan view of the crystalline silicon TFT 202.
Figure 6C:
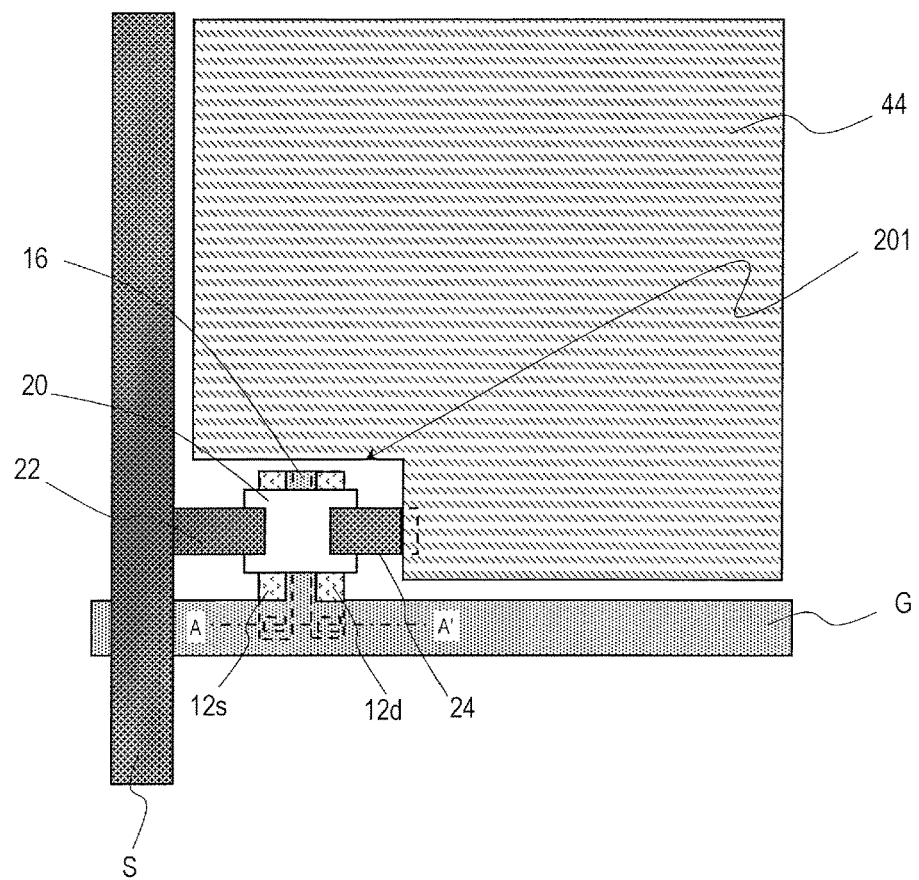
FIG. 6C is a plan view illustrating a pixel region including the oxide semiconductor TFT 201.
Figure 6D:
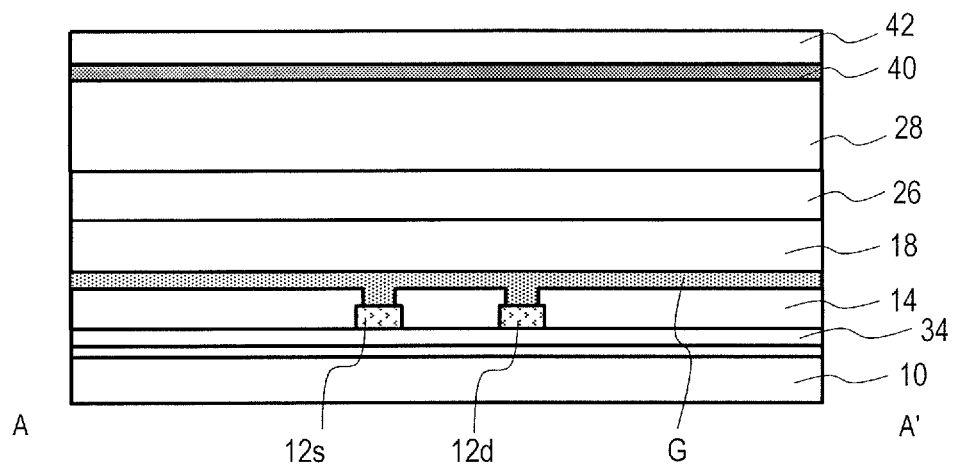
FIG. 6D is a diagram illustrating the connection structure between a sub-gate electrode 12 and a gate line G, and is an enlarged view showing a cross section taken along line A-A' of FIG. 6C.

FIG. 6A is a cross-sectional view showing an oxide semiconductor TFT 201 (hereinafter, an "OS-TFT") and a crystalline silicon TFT (hereinafter, a "PS-TFT") 202 of the semiconductor device 1001 of the present embodiment. Herein, like components to those of FIG. 1 are denoted by like reference signs and will not be described in detail below. FIG. 6B is a plan view of the PS-TFT 202, and FIG. 6C is a plan view illustrating a pixel region including the OS-TFT 201. FIG. 6D is an enlarged view showing a cross section taken along line A-A' of FIG. 6C.

As shown in FIG. 6A and FIG. 6C, each of the plurality of pixel regions includes a source line S, a gate line G, the OS-TFT 201, which is a pixel TFT, and a pixel electrode 44 connected to the drain electrode 24 of the OS-TFT 201.

The OS-TFT 201 has an offset structure described above with reference to FIG. 1. Note however that the sub-gate electrodes 12s and 12d are different from FIG. 1 in that they are arranged on an insulating layer 34 provided on the substrate 10. The insulating layer 34 functions as the gate insulating layer of the PS-TFT 202. Note that a base layer (base coat) 11 may be provided on the surface of the substrate 10.

The source electrode 22 of the OS-TFT 201 is electrically connected to the source line S. The main gate electrode 16 and the sub-gate electrode 12 are electrically connected to the gate line G. In this example, as shown in FIG. 6D, the sub-gate electrodes 12s and 12d extend to under the gate line G. In a region where the sub-gate electrodes 12s and 12d overlap the gate line G as seen from the direction normal to the substrate 10, the gate line G is in contact with each of the sub-gate electrodes 12s and 12d through an opening provided in the first insulating layer 14. Note that the structure and the arrangement of the contact portion between the gate line G and the sub-gate electrode 12 is not limited to the example shown in FIG. 6D. For example, the sub-gate electrodes 12s and 12d may be connected together under the gate line G. In this case, for one OS-TFT 201, there may be one opening for connecting the gate line G with the sub-gate electrode 12.

Provided on the upper insulating layer 28 are a common electrode 40, the pixel electrode 44, and a dielectric layer 42 arranged between these electrodes. The pixel electrode 44 is divided into portions corresponding to pixel regions. The pixel electrode 44 is connected to the drain electrode 24 of the OS-TFT 201 through a pixel contact hole formed in the dielectric layer 42, the upper insulating layer 28 and the protective layer 26.

As shown in FIG. 6A and FIG. 6B, the PS-TFT 202 is a top-gate-type TFT, for example. The PS-TFT 202 includes a crystalline silicon semiconductor layer (e.g., a low-temperature polysilicon layer) 32 formed on the substrate 10, the insulating layer 34 covering the crystalline silicon semiconductor layer 32, a gate electrode 36 provided on the insulating layer 34, a source electrode 38, and a drain electrode 39. A portion of the insulating layer 34 that is located between the crystalline silicon semiconductor layer 32 and the gate electrode 36 functions as the gate insulating layer of the PS-TFT 202. In the present specification, the insulating layer 34 may be referred to as a "PS-TFT gate insulating layer".

The crystalline silicon semiconductor layer 32 includes a channel region 32c, and a source region 32s and a drain region 32d located on the opposite sides of the active region. In this example, a portion of the crystalline silicon semiconductor layer 32 that overlaps the gate electrode 36 with the PS-TFT gate insulating layer 34 therebetween serves as the channel region 32c. An LDD (Lightly Doped Drain) region 32a may be provided between the channel region 32c and the source region 32s and the drain region 32d. Although the LDD region 32a does not overlap the gate electrode 36 herein, a part or whole of the LDD region 32a may overlap the gate electrode 36 with the PS-TFT gate insulating layer 34 therebetween.

The gate electrode 36 is formed by using the same conductive film (the sub-gate conductive film) as the sub-gate electrodes 12s and 12d of the OS-TFT 201. The first insulating layer 14, which is the sub-gate insulating layer of the OS-TFT 201, is provided to extend over the crystalline silicon semiconductor layer 32 and the gate electrode 36. The first insulating layer 14 is a portion of the sub-gate insulating layer of the OS-TFT 201, and is an interlayer insulating layer of the PS-TFT 202. Note that an "interlayer insulating layer" as used herein refers to an insulating layer, in the top-gate-type PS-TFT 202, that is arranged between the gate electrode 36 and the source and drain electrodes 38 and 39 so as to be in contact with the gate electrode 36.

The source electrode 38 and the drain electrode 39 are formed on the first insulating layer 14 by using the same conductive film (the main gate conductive film) as the main gate electrode 16 of the OS-TFT 201. The source electrode 38 and the drain electrode 39 are respectively connected to the source region 32s and the drain region 32d through contact holes 14s and 14d formed in the first insulating layer 14.

Over the PS-TFT 202, the second insulating layer 18, the protective layer 26 and the upper insulating layer 28 are provided to extend so as to cover the PS-TFT 202.

Note that in the present specification, the OS-TFT 201 may be referred to as a "first thin film transistor", and the source electrode 22 and the drain electrode of the OS-TFT 201 may be referred to as a "first source electrode" and a "first drain electrode", respectively. Similarly, the PS-TFT 202 may be referred to as a "second thin film transistor", and the source electrode 38, the drain electrode 39 and the gate electrode 36 of the PS-TFT 202 may be referred to as a "second source electrode", a "second drain electrode" and a "second gate electrode", respectively.

In the present embodiment, the sub-gate electrodes 12s and 12d of the OS-TFT 201 and the gate electrode 36 of the PS-TFT 202 are formed in the same layer. Therefore, the first insulating layer 14, which serves as a portion of the sub-gate insulating layer of the OS-TFT 201, functions as the interlayer insulating layer in the PS-TFT 202. Note that in the present specification, "being formed in the same layer" refers to being formed by using the same film (conductive film). Then, it is possible to suppress an increase in the number of manufacturing steps and the manufacturing cost.

Since the sub-gate electrodes 12s and 12d are arranged so as to correspond to the offset regions 30s and 30d of the OS-TFT 201 as in the embodiment described above, it is possible to suppress a decrease in the ON current due to the offset structure. Moreover, by forming the sub-gate electrodes 12s and 12d and the gate electrode 36 of the PS-TFT 202 in the same layer, it is possible to simplify the manufacturing steps.

Figure 7:
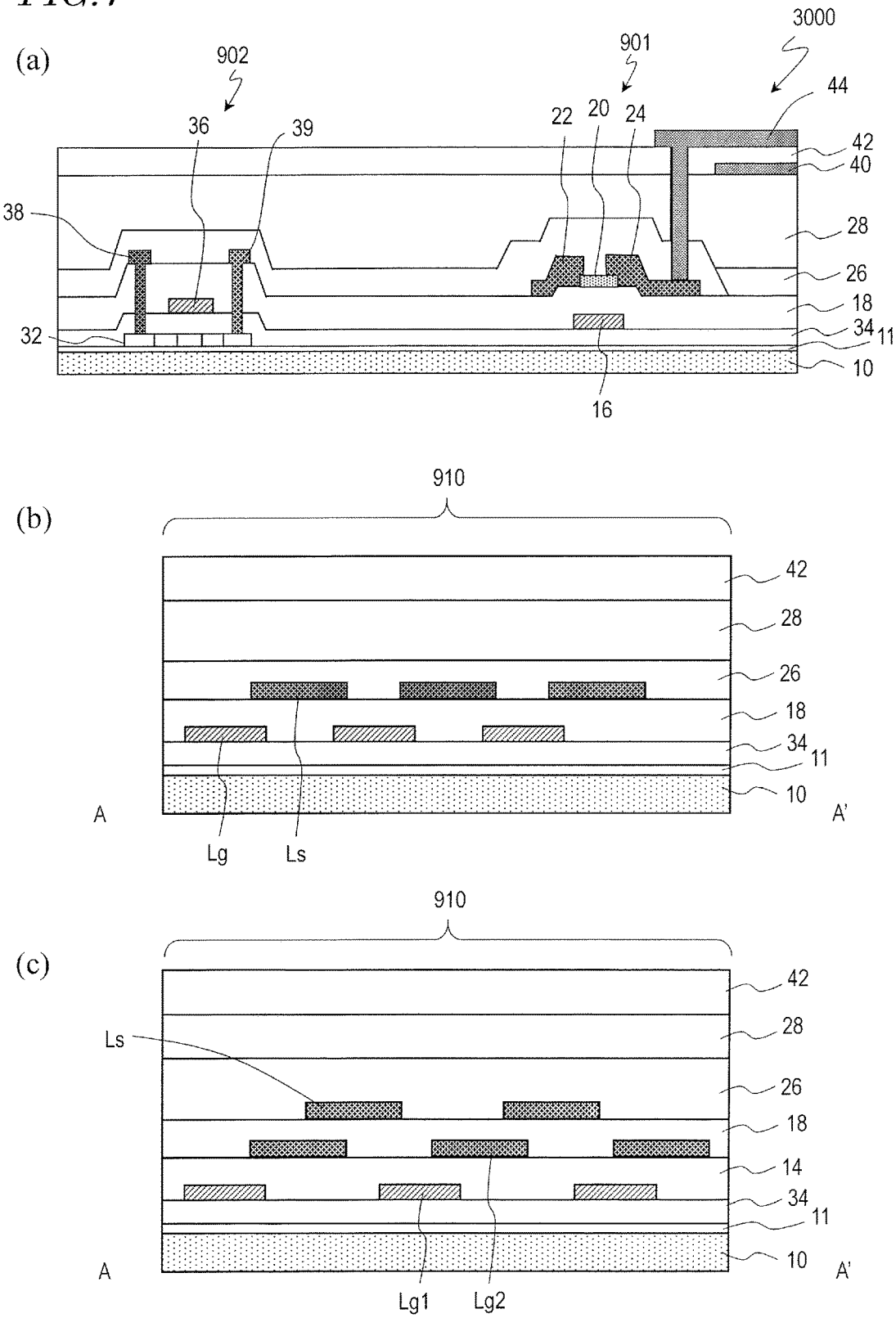
FIG. 7(a) is a cross-sectional view showing an oxide semiconductor TF and a crystalline silicon semiconductor TFT of a semiconductor device 3000 of a reference example.
FIG. 7(b) is a cross-sectional view showing a wiring region of the semiconductor device 3000 of the reference example.
FIG. 7(c) is a cross-sectional view schematically illustrating a wiring region of the semiconductor device 1001 of the second embodiment.
Figure 8:
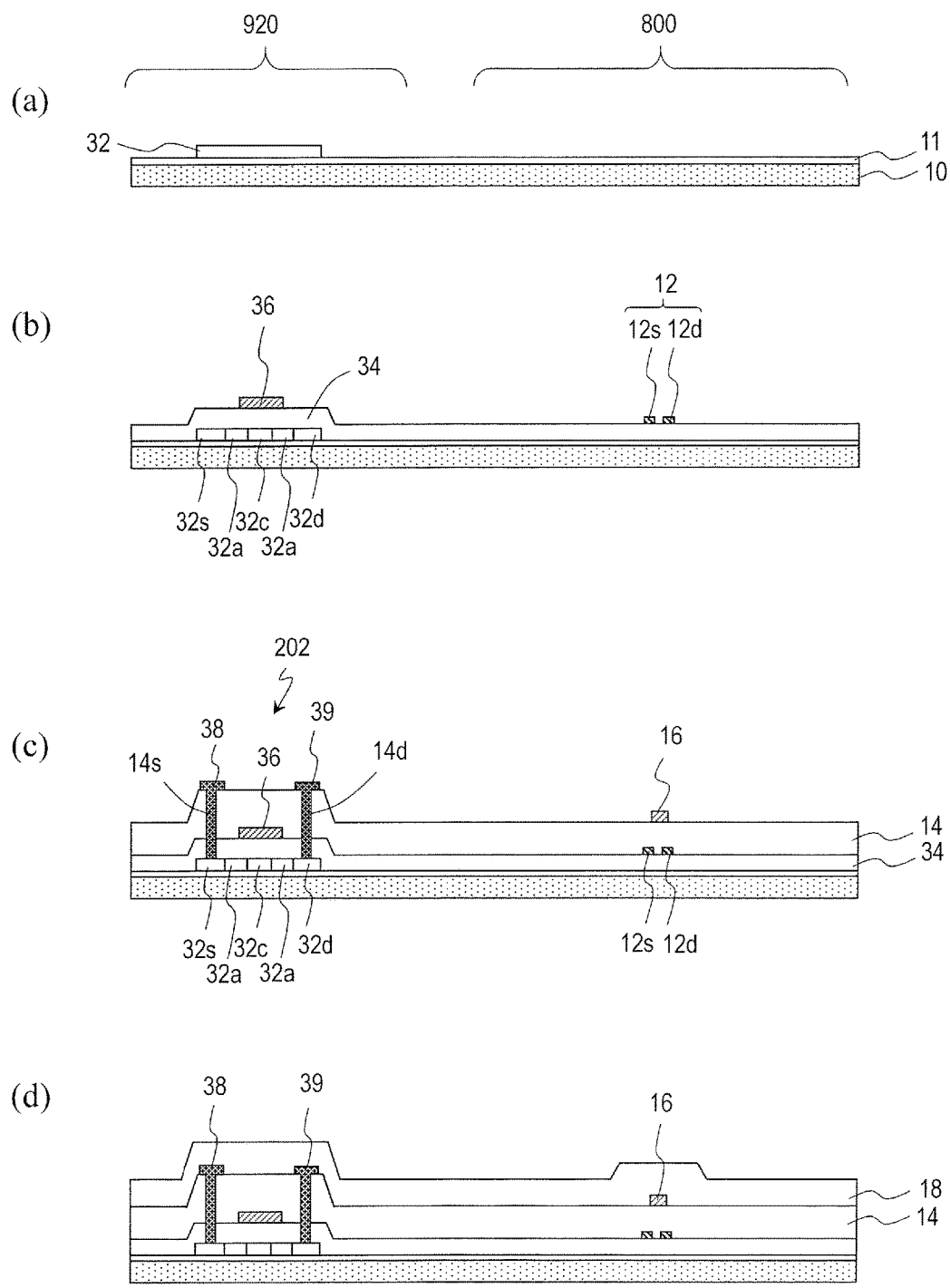
FIGS. 8(a) to 8(d) are schematic process cross-sectional views illustrating a method for manufacturing the semiconductor device 1001.
Figure 9:
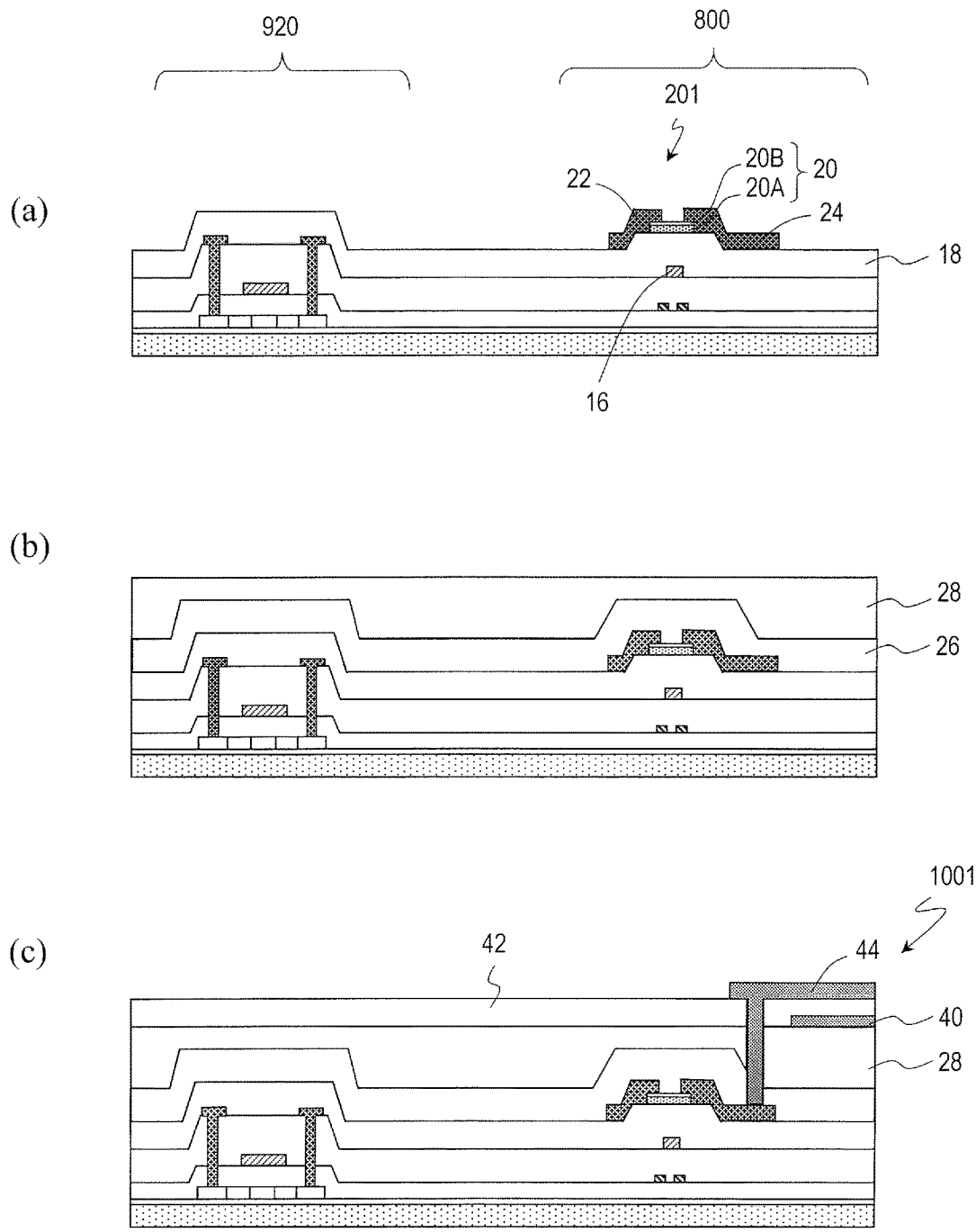
FIGS. 9(a) to 9(c) are schematic process cross-sectional views illustrating the method for manufacturing the semiconductor device 1001.

FIG. 7(a) is a cross-sectional view showing a semiconductor device 3000 of a reference example including an oxide semiconductor TFT 901 and a crystalline silicon TFT 902 on the same substrate.

The semiconductor device 3000 of the reference example differs from the OS-TFT 201 shown in FIG. 6 in that the oxide semiconductor TFT 901 is a bottom-gate type TFT having an offset structure and the oxide semiconductor TFT 901 does not include sub-gate electrodes. The crystalline silicon TFT 902 is a top-gate-type TFT having a similar configuration to the PS-TFT 202 shown in FIG. 6. In FIG. 7(a), like components to those of FIG. 6 are denoted by like reference signs for the sake of simplicity.

In the semiconductor device 3000, the gate electrodes 16 and 36 of the oxide semiconductor TFT 901 and the crystalline silicon TFT 902 are formed in the same layer (the gate line layer). The source and drain electrodes 22, 24, 38 and 39 of the oxide semiconductor TFT 901 and the crystalline silicon TFT 902 are formed in the same layer (the source line layer). Note that a configuration in which the gate electrodes of a crystalline silicon TFT and an oxide semiconductor TFT are formed in the same layer and the source-drain electrodes of the crystalline silicon TFT and the oxide semiconductor TFT are formed in the same layer is disclosed in Japanese Laid-Open Patent Publication No. 2010-3910, for example.

In the semiconductor device 3000 of the reference example, the second insulating layer 18 functions as the gate insulating layer of the oxide semiconductor TFT 901 (corresponding to the main gate insulating layer of the present embodiment), and also functions as the interlayer insulating layer of the crystalline silicon TFT 902. However, while there is a demand for increasing the thickness of the interlayer insulating layer of the crystalline silicon TFT 902 in order to reduce the gate-source parasitic capacitance, there is a demand for decreasing the thickness of the gate insulating layer of the oxide semiconductor TFT 901 in order to improve the driving ability of the oxide semiconductor TFT 901. Therefore, it is difficult to set the thickness of the second insulating layer 18 so that both of the TFTs can have desired characteristics. Moreover, while an insulating film having a low hydrogen content is preferably used for the gate insulating layer in order to ensure the reliability of the oxide semiconductor TFT 901, this differs from the property required of the interlayer insulating layer of the crystalline silicon TFT 902.

In contrast, in the semiconductor device 1001 of the present embodiment, the first insulating layer 14 to be the interlayer insulating layer of the PS-TFT 202 and the second insulating layer 18 to be the main gate insulating layer of the OS-TFT 201 are formed in separate layers. Therefore, the conditions such as the thickness and the material of the interlayer insulating layer of the PS-TFT 202 and those of the main gate insulating layer of the OS-TFT 201 can be optimized independently of each other, depending on the application of each TFT. As a result, it is possible to realize the reliability and the characteristics for both of the OS-TFT 201 and the PS-TFT 202.

A hydrogen-donating layer that is capable of supplying hydrogen may be used as the interlayer insulating layer of the PS-TFT 202. Then, during the heat treatment performed after the formation of the interlayer insulating layer, hydrogen can be supplied from the hydrogen-donating layer to the crystalline silicon semiconductor layer, and it is possible to reduce the crystal defects occurring in the crystalline silicon semiconductor layer. The interlayer insulating layer may be, for example, a silicon nitride (SiNx) layer primarily including silicon nitride, a silicon nitride oxide (SiNxOy: x>y) layer, an $SiO_2$ film (TEOS film) formed by a CVD method using TEOS (Tetra Ethyl Ortho Silicate) as its material, or a layered film thereof. The preferred thickness of the interlayer insulating layer of the PS-TFT 202 is 50 nm or more and 200 nm or less, for example.

On the other hand, an oxygen-donating layer that is capable of supplying oxygen may be used as the main gate insulating layer of the OS-TFT 201. For example, it may be a silicon oxide (SiOx) layer primarily including silicon oxide, a silicon oxide nitride (SiOxNy: x>y) layer, or the like. Then, oxygen is supplied from the oxygen-donating layer to the oxide semiconductor layer 20, and it is possible to reduce the oxygen deficiency occurring in the oxide semiconductor layer 20. Therefore, it is possible to enhance the reliability of the OS-TFT 201. Note that when an SiOx layer is used as the oxygen-donating layer, a good channel interface can be formed at the interface with the oxide semiconductor layer 20, and it is therefore possible to further improve the reliability of the OS-TFT 201. The preferred thickness of the main gate insulating layer of the OS-TFT 201 is 200 nm or more and 500 nm or less, for example.

Moreover, the present embodiment also provides an advantage that it is possible to decrease the area of the wiring region 910 shown in FIG. 5.

FIG. 7(b) is a cross-sectional view schematically showing a portion of a wiring region of the semiconductor device 3000 of the reference example, and FIG. 7(c) is a cross-sectional view schematically showing a portion of the wiring region 910 of the semiconductor device 1001 of the present embodiment. FIG. 7(b) and FIG. 7(c) correspond to a cross section taken along line A-A' shown in FIG. 5.

In the semiconductor device 3000 of reference example 1, wiring layers (metal layers) used as signal lines are two layers, i.e., the gate line layer and the source line layer. Therefore, as can be seen from FIG. 7(b), the wiring region 910 includes lines Ls in the source line layer and lines Lg in the gate line layer, which are arranged alternately (two-layer wiring), as seen from the direction normal to the substrate 10. In contrast, in the present embodiment, as shown in FIG. 7(c), lines Lg1 provided in the same layer (the sub-gate line layer) as the sub-gate electrode 12 of the OS-TFT 201, lines Lg2 provided in the same layer (the main gate line layer) as the main gate electrode 16 of the OS-TFT 201, and lines Ls provided in the same layer (the source line layer) as the source electrode 22 of the OS-TFT 201 can be arranged alternately (three-layer wiring), as seen from the direction normal to the substrate 10. Therefore, it is possible to reduce the size of the wiring region 910 and reduce the capacitance between lines, as compared with two-layer wiring.

In the present embodiment, it is only required that the OS-TFT 201 and the PS-TFT 202 be formed on the same substrate, and there is no particular limitation on the applications of the TFTs. Note however that using the OS-TFT 201 as a pixel TFT and the PS-TFT 202 as a driving TFT provides an advantage as follows.

The OFF leak current of the OS-TFT 201 is as small as (1/1000) that of a polycrystalline silicon TFT, for example. Therefore, by making the OS-TFT 201 function as a pixel TFT, it is possible to reduce the power consumption. Moreover, the oxide semiconductor layer 20 can be connected to the source electrode 22 and the drain electrode 24 without using contact holes therebetween. Therefore, as compared with a case in which the crystalline silicon TFT is used as a pixel TFT, for example, it is possible to reduce the area of the contact hole portion, and it is therefore possible to increase the aperture ratio. On the other hand, since the PS-TFT 202 has a high mobility, it is possible to reduce the circuit area.

Next, a method for manufacturing the semiconductor device 1001 of the present embodiment will be described.

FIGS. 8(a) to 8(d) and FIGS. 9(a) to 9(c) are process cross-sectional views illustrating an example of a method for manufacturing the semiconductor device 1001.

First, a base layer 11 is formed on the substrate 10. Then, in the driving circuit region 920, an island-shaped crystalline silicon semiconductor layer (herein, a polysilicon layer) 32 is formed on the base layer 11. The thickness of the crystalline silicon semiconductor layer 32 may be 30 nm or more and 70 nm or less, for example.

Any of various substrates such as a glass substrate, a resin plate or a resin film may be used as the substrate 10. While there is no particular limitation on the base layer 11, a layered film may be formed whose lower layer is a silicon nitride (SiNx) film and whose upper layer is a silicon oxide (SiOx) film, for example. The crystalline silicon semiconductor layer 32 is formed for example by forming and crystallizing an amorphous silicon (a-Si) film and patterning the obtained crystalline silicon film. The formation of the a-Si film can be done by a known method such as a plasma CVD (Chemical Vapor Deposition) method or a sputtering method, for example. The crystallization of the a-Si film may be done by using an excimer laser annealing method on the a-Si film, for example.

Next, as shown in FIG. 8(b), the PS-TFT gate insulating layer (thickness: 50 nm or more and 130 nm or less, for example) 34 is formed so as to cover the crystalline silicon semiconductor layer 32. While there is no particular limitation on the PS-TFT gate insulating layer 34, it is an SiNx film, for example. Herein, the PS-TFT gate insulating layer 34 is provided to extend over the display region 800.

Then, after the sub-gate conductive film is formed, it is patterned. Thus, the gate electrode 36 is provided in the driving circuit region 920 so as to overlap a portion of the crystalline silicon semiconductor layer 32 with the PS-TFT gate insulating layer 34 therebetween, and the sub-gate electrodes 12s and 12d are provided in the display region 800. The material, the thickness, etc., of the sub-gate conductive film may be similar to those of the embodiment described above. Herein, a layered film (Ti/Al/Ti) including a Ti film, an Al film and a Ti film stacked in this order is used, for example.

Thereafter, the crystalline silicon semiconductor layer 32 is doped with an impurity using the gate electrode 36 as a doping mask, thereby forming a first impurity-doped region (the first impurity doping step). Then, a resist mask (not shown) is formed, and a portion of the first impurity-doped region is further doped with an impurity using the resist mask as a doping mask, thereby forming the source region 32s and the drain region 32d (the second impurity doping step). The region of the first impurity-doped region that is not doped with an impurity during the second impurity doping step serves as the LDD region 32a. The region of the crystalline silicon semiconductor layer 32 that is not doped with an impurity during either one of the two impurity doping steps serves as the active region (channel region) 32c. Note that only the first impurity doping step described above may be performed, in which case the LDD region is not formed.

Then, as shown in FIG. 8(c), the first insulating layer 14 is formed that covers the gate electrode 36 and the sub-gate electrodes 12s and 12d. The material, the thickness, etc., of the first insulating layer 14 may be similar to those of the embodiment described above. An SiNx film may be formed as the first insulating layer 14. An SiO$_2$ film (TEOS film) may be formed by a CVD method using TEOS (Tetra Ethyl Ortho Silicate) as its material. Alternatively, a layered film including an SiNx film and a TEOS film may be formed. Herein, a layered film is used, in which a TEOS film (thickness: 700 m, for example), an SiNx film (thickness: 300 nm, for example) and a TEOS film (thickness: 100 nm, for example) are stacked in this order starting from the gate electrode 36 side. The first insulating layer 14 functions as the interlayer insulating layer of the PS-TFT and as a portion of the sub-gate insulating layer of the OS-TFT. Note that since the first insulating layer 14 is not in contact with the oxide semiconductor layer of the OS-TFT, the first insulating layer 14 may be a layer having a relatively high hydrogen content.

Next, the contact holes 14s and 14s are formed in the PS-TFT gate insulating layer 34 and the first insulating layer 14 so as to reach the source region 32s and the drain region 32d of the crystalline silicon semiconductor layer 32, respectively.

Thereafter, a conductive film (the main gate conductive film) is formed on the first insulating layer 14 and in the contact holes, and the conductive film is patterned. Thus, the source electrode 38 that is in contact with the source region 32s through the contact hole 14s and the drain electrode 39 that is in contact with the drain region 32d through the contact hole 14d are formed in the driving circuit region 920, while the gate electrode 16 is formed in the display region 800. The PS-TFT 202, which is a driving TFT, is manufactured as described above.

The material, the thickness, etc., of the main gate conductive film may be similar to those of the embodiment described above. Herein, a layered film (Ti/Al/Ti) including a Ti film, an Al film and a Ti film stacked in this order is used, for example.

Then, as shown in FIG. 8(d), the second insulating layer 18 is formed so as to cover the source electrode 38 and the drain electrode 39 of the PS-TFT 202 and the gate electrode 16 of the OS-TFT. The second insulating layer 18 functions as the main gate insulating layer of the OS-TFT. The formation method, the material, the thickness, etc., of the second insulating layer 18 may be similar to those of the embodiment described above.

Then, as shown in FIG. 9(a), the island-shaped oxide semiconductor layer 20 is formed on the second insulating layer 18, and then the source electrode 22 and the drain electrode 24 are formed so as to be in contact with the oxide semiconductor layer 20. The formation method, the material, the thickness, etc., of the oxide semiconductor layer 20 and the source electrode 22 and the drain electrode 24 are similar to those of the embodiment described above. The OS-TFT 201, which is a pixel TFT, is manufactured as described above.

Then, as shown in FIG. 9(b), the protective layer 26 and the upper insulating layer 28 are formed so as to cover PE-TFT 202 and the OS-TFT 201. The formation method, the material, the thickness, etc., of these layers are similar to those of the embodiment described above.

Then, as shown in FIG. 9(c), the common electrode 40 is formed on the upper insulating layer 28. The common electrode 40 can be formed by using a transparent conductive film such as an ITO (indium tin oxide) film, an IZO film or a ZnO film (zinc oxide film). The common electrode 40 may be formed across substantially the entirety of the display region 800, excluding the region that is located above the OS-TFT 201, for example.

Then, the dielectric layer 42 is formed on the upper insulating layer 28 so as to cover the common electrode 40. For example, the dielectric layer 42 may suitably be a silicon oxide (SiOx) film, a silicon nitride (SiNx) film, a silicon oxide nitride (SiOxNy; x>y) film, a silicon nitride oxide (SiNxOy; x>y) film, or the like.

Thereafter, an opening (the pixel contact hole) is formed by photolithography in the dielectric layer 42, the protective layer 26 and the upper insulating layer 28 so that the drain electrode 24 of the OS-TFT 201 is exposed therethrough. Then, the pixel electrode 44 is formed on the upper insulating layer 28 and in the pixel contact hole so as to be in contact with the drain electrode 24 through the pixel contact hole. The pixel electrode 44 can be formed by using a transparent conductive film such as an ITO film, an IZO film or a ZnO film. Although not shown in the figures, compatibility with display devices of the FFS mode and the IPS mode can be realized by changing the planar pattern of the pixel electrode 44 by, for example, providing slit-shaped openings in the pixel electrode 44. Thus, the semiconductor device 1001 of the present embodiment is obtained.

At least a portion of the pixel electrode 44 may be arranged so as to overlap the common electrode 40 with the dielectric layer 42 therebetween. Thus, a capacitor is formed in a portion where the pixel electrode 44 and the common electrode 40 overlap each other with the dielectric layer 42 therebetween. This capacitor functions as a storage capacitor. It is possible to obtain a storage capacitor having a desired capacitance by appropriately adjusting the material and the thickness of the dielectric layer 42 to be the dielectric layer of the storage capacitor, and the area of a portion thereof that is to be the capacitor. Therefore, there is no need to separately form a storage capacitor, in a pixel, by using the same metal film as the source line, for example. Therefore, it is possible to suppress a decrease in the aperture ratio due to the formation of a storage capacitor using a metal film.

Note that the pixel electrode 44 may be formed on the upper insulating layer 28 without providing the common electrode 40 and the dielectric layer 42. Such a semiconductor device can also be applied to display devices of the VA mode.

The semiconductor device 1001 of the present embodiment may further include another OS-TFT that does not have an offset structure. The other OS-TFT may have the same configuration as the OS-TFT 201 except that it does not have an offset structure and it does not include sub-gate electrodes.

FIGS. 10(a) and 10(b) are a cross-sectional view and a plan view, respectively, illustrating an OS-TFT 203 that does not have an offset structure. Like components to those of the OS-TFT 201 are denoted by like reference signs for the sake of simplicity. The OS-TFT 203 is a pixel TFT, for example, and the OS-TFT 201 and the PE-TFT 202 are circuit TFTs, for example.

As shown in FIG. 10, the gate electrode 16 is arranged so as to overlap the entire channel formation region of the oxide semiconductor layer 20 with the second insulating layer 18 therebetween. A light blocking layer 46, which is formed by using the same conductive film as the gate electrode 36 of the PS-TFT 202, is arranged between the OS-TFT 203 and the substrate 10. Thus, the width of the gate electrode 16 in the channel length direction can be made smaller as compared with a case in which the gate electrode 16 of the OS-TFT 203 is made to function as a light blocking layer. Therefore, it is possible to reduce the parasitic capacitance occurring between the source and drain electrodes 22 and 24 and the light blocking layer while suppressing the influence of the light from the backlight on the oxide semiconductor layer 20. In this example, at least a portion of the source-side end portion (the source contact region) and at least a portion of the drain-side end portion (the drain contact region) of the oxide semiconductor layer 20 are not shaded by the gate electrode 16 but are shaded by the light blocking layer 46. Note that the light blocking layer 46 is only required to be arranged so as to cover a region of the oxide semiconductor layer 20 that is not shaded by the gate electrode 16, and does not need to cover the entirety of the oxide semiconductor layer 20.

Third Embodiment

A third embodiment of a semiconductor device of the present invention will now be described, using an active matrix substrate of a display device as an example.

Figure 11:
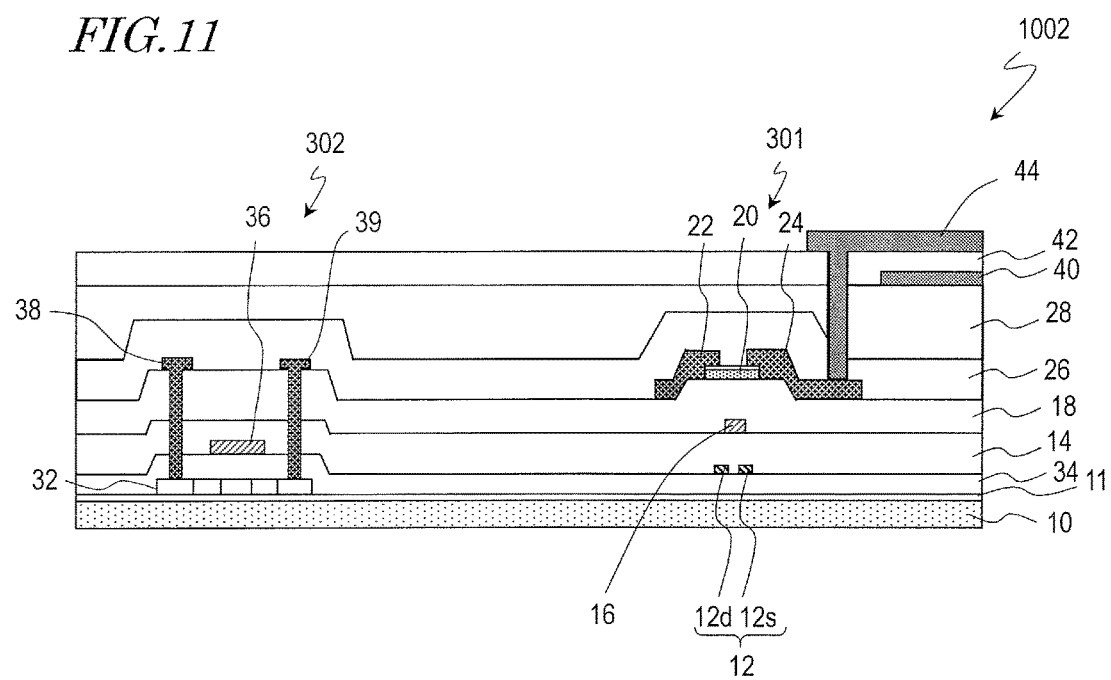
FIG. 11 is a schematic cross-sectional view of a semiconductor device 1002 of a third embodiment.

FIG. 11 is a cross-sectional view showing an OS-TFT 301 and a PS-TT 302 in a semiconductor device 1002 of the present embodiment.

While the source and drain electrodes 38 and 39 of the PS-TFT 202 are formed in the same layer (the main gate line layer) as the main gate electrode 16 of the OS-TFT 201 in the embodiment described above, they are formed in the same layer (the source line layer) as the source and drain electrodes 22 and 24 of the OS-TFT 301 in the present embodiment. Otherwise, the configuration is similar to that of the semiconductor device 1001 described above with reference to FIG. 6. Like components to those of FIG. 6 are denoted by like reference signs and will not be described below.

Also in the present embodiment, as in the second embodiment, since the first insulating layer 14 to be the interlayer insulating layer of the PS-TFT 302 and the second insulating layer 18 to be the main gate insulating layer of the OS-TFT 301 are formed in separate layers, it is possible to independently optimize the material, the thickness, etc., of these layers. Therefore, it is possible to realize a high reliability and good TFT characteristics.

The semiconductor device 1002 can be formed by a method similar to the method for manufacturing the semiconductor device 1001 described above with reference to FIG. 8 and FIG. 9. A method for manufacturing the semiconductor device 1002 will be described with reference to FIGS. 12(a) to 12(c). In the following description, steps similar to those of the semiconductor device 1001 will be omitted. Moreover, the formation method, the material, the thickness, etc., of the components of the semiconductor device 1002 are similar to those of the semiconductor device 1001, and will not be described below.

First, the base layer 11, the crystalline silicon semiconductor layer 32, the insulating layer 34, the gate electrode 16, the sub-gate electrodes 12s and 12d and the first insulating layer 14 are formed on the substrate 10 by a method similar to the embodiment described above.

Figure 12:
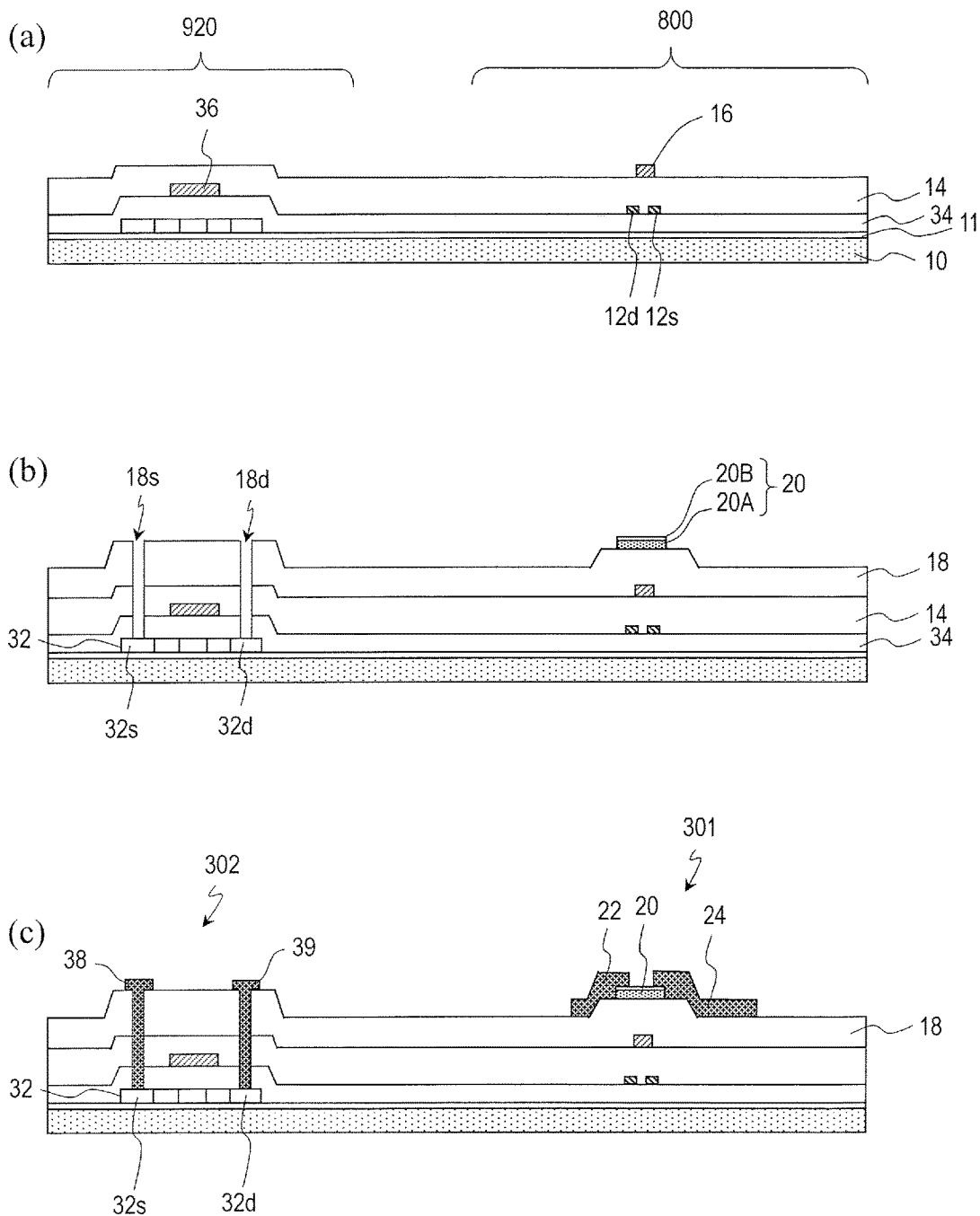
FIGS. 12(a) to 12(c) are schematic process cross-sectional views illustrating a method for manufacturing the semiconductor device 1002.

Then, as shown in FIG. 12(a), in the display region 800, the gate electrode 16 is formed on the first insulating layer 14.

Then, as shown in FIG. 12(b), the second insulating layer 18 is formed so as to cover the first insulating layer 14 and the gate electrode 16. Thereafter, in the display region 800, the oxide semiconductor layer 20 is formed. Contact holes 18s and 18d are formed in the driving circuit region 920 so as to reach the source region 32s and the drain region 32d of the crystalline silicon semiconductor layer 32, respectively.

Thereafter, as shown in FIG. 12(c), a source conductive film is formed and patterned, thereby forming the source electrode 22 and the drain electrode 24 in contact with the oxide semiconductor layer 20, and forming the source electrode 38 and the drain electrode 39 in contact with the crystalline silicon semiconductor layer 32 through the contact holes 18s and 18d. Then, although not shown in the figures, the protective layer 26, the upper insulating layer 28, the common electrode 40, the dielectric layer 42 and the pixel electrode 44 are formed, thereby obtaining the semiconductor device 1002.

The embodiments of the semiconductor device of the present invention are not limited to the first to third embodiments described above.

For example, while the PS-TFTs 202 and 302 both have an LDD structure in the embodiments described above, the TFT may have a GOLD (Gate-Overlapped LDD) structure in which the LDD region overlaps the gate electrode. Alternatively, the TFT may not include the LDD region (the single-drain structure). As necessary, the crystalline silicon semiconductor layer 32 may be subjected to channel doping for controlling the threshold voltage.

The applications of the OS-TFT and the PS-TFT and the regions where they are formed in the embodiments described above are not limited to those described above. It is only required that in a device including a plurality of TFTs, two types of TFTs using different active layers can be used depending on the characteristics required of the TFTs. For example, the OS-TFTs 201 and 301 may each be used not only as a pixel TFT but also as a circuit element of a driving circuit.

INDUSTRIAL APPLICABILITY

The embodiments of the present invention are widely applicable to devices and electronic appliances including a plurality of thin film transistors. For example, the embodiments of the present invention are applicable to circuit substrates such as active matrix substrates, display devices such as liquid crystal display devices, organic electroluminescence (EL) display devices and inorganic electroluminescence display devices, radiation detectors, imaging devices such as image sensors, electronic devices such as image input devices and fingerprint reader devices, etc.

REFERENCE SIGNS LIST

10 Substrate
11 Base layer
12, 12s, 12d Sub-gate electrode
14 First insulating layer
16 Main gate electrode
18 Second insulating layer
20 Oxide semiconductor layer
20g Gate opposing region
20s Source contact region
20d Drain contact region
20c Channel formation region
22 Source electrode
24 Drain electrode
26 Protective layer
28 Upper insulating layer
30, 30s, 30d Offset region
32 Crystalline silicon semiconductor layer
34 Third insulating layer
36 Gate electrode of crystalline silicon TFT
38 Source electrode of crystalline silicon TFT
39 Drain electrode of crystalline silicon TFT
40 Common electrode
42 Dielectric layer
44 Pixel electrode
101, 201, 301 Oxide semiconductor TFT
202, 302 Crystalline silicon TFT
1001, 1002 Semiconductor device

The invention claimed is:

1. A semiconductor device comprising a substrate and a first thin film transistor provided on the substrate, the first thin film transistor including:
at least one sub-gate electrode;
a first insulating layer covering the sub-gate electrode;
a main gate electrode formed on the first insulating layer;
a second insulating layer covering the main gate electrode;
an oxide semiconductor layer arranged so as to partially overlap the main gate electrode with the second insulating layer therebetween, wherein the oxide semiconductor layer has a layered structure of a first layer and a second layer provided on the first layer, the second layer having a larger band gap than the first layer; and
a first source electrode and a first drain electrode electrically connected to the oxide semiconductor layer, the oxide semiconductor layer including:
a gate opposing region that overlaps the main gate electrode as seen from a direction normal to the substrate;
a source contact region that is in contact with the first source electrode;
a drain contact region that is in contact with the first drain electrode; and
an offset region that is provided at least one of between the gate opposing region and the source contact region and between the gate opposing region and the drain contact region,
wherein at least a portion of the offset region overlaps the sub-gate electrode with the first insulating layer and the second insulating layer therebetween.

2. The semiconductor device of claim 1, wherein as seen from a direction normal to the substrate, the offset region is provided adjacent to the gate opposing region and overlaps none of the main gate electrode, the first source electrode and the first drain electrode.

3. The semiconductor device of claim 1, wherein:
the offset region includes a source-side offset region that is arranged between the gate opposing region and the source contact region, and a drain-side offset region that is arranged between the gate opposing region and the drain contact region;
the sub-gate electrode includes a source-side sub-gate electrode that overlaps at least a portion of the source-side offset region with the first insulating layer and the second insulating layer therebetween, and a drain-side sub-gate electrode that overlaps at least a portion of the drain-side offset region with the first insulating layer and the second insulating layer therebetween; and
as seen from a direction normal to the substrate, the source-side sub-gate electrode and the drain-side sub-gate electrode are arranged spaced apart from each other under the main gate electrode.

4. The semiconductor device of claim 1, wherein as seen from a direction normal to the substrate, the sub-gate electrode overlaps either one of the first source electrode and the first drain electrode, and a portion of the sub-gate electrode that overlaps the first source electrode or the first drain electrode has a length of 0 μm or more and 1 μm or less in a channel length direction.

5. The semiconductor device of claim 1, wherein as seen from a direction normal to the substrate, the sub-gate electrode overlaps either one of a first source electrode-side end portion or a first drain electrode-side end portion of the main gate electrode, and a portion of the sub-gate electrode that overlaps the first source electrode-side end portion or the first drain electrode-side end portion of the main gate electrode has a length of 0 μm or more and 1 μm or less in a channel length direction.

6. The semiconductor device of claim 1, further comprising a second thin film transistor supported on the substrate, wherein:
the second thin film transistor includes:
a crystalline silicon semiconductor layer primarily including a crystalline silicon;
a third insulating layer covering the crystalline silicon semiconductor layer;
a second gate electrode arranged on the third insulating layer so as to overlap at least a portion of the crystalline silicon semiconductor layer with the third insulating layer therebetween; and a second source electrode and a second drain electrode electrically connected to the crystalline silicon semiconductor layer, wherein the main gate electrode of the first thin film transistor and the second gate electrode of the second thin film transistor are provided in different layers.

7. The semiconductor device of claim 6, wherein:
the second gate electrode of the second thin film transistor and the sub-gate electrode of the first thin film transistor are formed in the same layer; and
the first insulating layer is provided to extend to over the second gate electrode of the second thin film transistor.

8. The semiconductor device of claim 7, wherein:
the second source electrode and the second drain electrode of the second thin film transistor are formed in the same layer as the main gate electrode of the first thin film transistor; and
the second source electrode and the second drain electrode are in contact with the crystalline silicon semiconductor layer through a contact hole formed in the first insulating layer and the third insulating layer.

9. The semiconductor device of claim 7, wherein:
the second source electrode and the second drain electrode of the second thin film transistor are formed in the same layer as the first source electrode and the first drain electrode of the first thin film transistor; and
the second source electrode and the second drain electrode are in contact with the crystalline silicon semiconductor layer in a contact hole formed in the second insulating layer, the first insulating layer and the third insulating layer.

10. The semiconductor device of claim 6, further comprising a display region that includes a plurality of pixels, and a driving circuit region that is provided in a region other than the display region and includes a driving circuit;
the first thin film transistor is arranged in each pixel of the display region; and
the second thin film transistor forms a part of the driving circuit in the driving circuit region.

11. The semiconductor device of claim 1, wherein the first thin film transistor has a channel-etch structure.

12. The semiconductor device of claim 1, wherein the oxide semiconductor layer includes an In—Ga—Zn—O-based semiconductor.

13. The semiconductor device of claim 12, wherein the oxide semiconductor layer includes a crystalline portion.

14. A method for manufacturing a semiconductor device including a first thin film transistor that has an oxide semiconductor layer as an active layer and a second thin film transistor that has a crystalline silicon semiconductor layer as an active layer, the method comprising the steps of:
(A) forming a crystalline silicon semiconductor layer on a substrate;
(B) forming a third insulating layer on the crystalline silicon semiconductor layer;
(C) forming a sub-gate conductive film on the third insulating layer and patterning the sub-gate conductive film, thereby forming a gate electrode of the second thin film transistor and a sub-gate electrode of the first thin film transistor;
(D) forming a first insulating layer that covers the gate electrode of the second thin film transistor and the sub-gate electrode of the first thin film transistor, and forming a source contact hole and a drain contact hole in the third insulating layer and the first insulating layer, wherein a portion of the crystalline silicon semiconductor layer is exposed through the source contact hole and the drain contact hole;
forming a main gate conductive film on the first insulating layer and in the source contact hole and the drain contact hole and patterning the main gate conductive film, thereby forming source and drain electrodes of the second thin film transistor and a main gate electrode of the first thin film transistor, wherein the source and drain electrodes of the second thin film transistor are in contact with the crystalline silicon semiconductor layer through the source contact hole and the drain contact hole, respectively;
(E) forming a second insulating layer that covers the source and drain electrodes of the second thin film transistor and the main gate electrode of the first thin film transistor;
(F) forming an oxide semiconductor layer on the second insulating layer so as to partially overlap the main gate electrode with the second insulating layer therebetween, wherein the oxide semiconductor layer has a layered structure of a first layer and a second layer arranged on the first layer, the second layer having a larger band gap than the first layer; and
(G) forming a source electrode of the first thin film transistor so as to be in contact with a portion of the oxide semiconductor layer and forming a drain electrode of the first thin film transistor so as to be in contact with another portion of the oxide semiconductor layer,
wherein where a portion of the oxide semiconductor layer that overlaps the main gate electrode is denoted as a gate opposing region, a portion thereof that is in contact with the source electrode as a source contact region and a portion thereof that is in contact with the drain electrode as a drain contact region, as seen from a direction normal to the substrate, the oxide semiconductor layer includes an offset region that is provided at least one of between the gate opposing region and the source contact region and between the gate opposing region and the drain contact region, and at least a portion of the offset region overlaps the sub-gate electrode with the first insulating layer and the second insulating layer therebetween.

15. A method for manufacturing a semiconductor device including a first thin film transistor that has an oxide semiconductor layer as an active layer and a second thin film transistor that has a crystalline silicon semiconductor layer as an active layer, the method comprising the steps of:
(A) forming a crystalline silicon semiconductor layer on a substrate;
(B) forming a third insulating layer on the crystalline silicon semiconductor layer;
(C) forming a sub-gate conductive film on the third insulating layer and patterning the sub-gate conductive film, thereby forming a gate electrode of the second thin film transistor and a sub-gate electrode of the first thin film transistor;
(D) forming a first insulating layer that covers the gate electrode of the second thin film transistor and the sub-gate electrode of the first thin film transistor;
forming a main gate conductive film on the first insulating layer and patterning the main gate conductive film, thereby forming a main gate electrode of the first thin film transistor;
(E) forming a second insulating layer that covers the main gate electrode of the first thin film transistor;

(F) forming a source contact hole and a drain contact hole in the third insulating layer, the first insulating layer and the second insulating layer, wherein a portion of the crystalline silicon semiconductor layer is exposed through the source contact hole and the drain contact hole;

(G) forming an oxide semiconductor layer to be an active layer of the first thin film transistor on the second insulating layer so as to partially overlap the main gate electrode with the second insulating layer therebetween, wherein the oxide semiconductor layer has a layered structure of a first layer and a second layer arranged on the first layer, the second layer having a larger band gap than the first layer; and (H) forming a source conductive film on the second insulating layer, on the oxide semiconductor layer and in the source contact hole and in the drain contact hole and patterning the source conductive film, thereby forming a source electrode of the first thin film transistor that is in contact with a portion of the oxide semiconductor layer, a drain electrode of the first thin film transistor that is in contact with another portion of the oxide semiconductor layer, a source electrode of the second thin film transistor that is in contact with a portion of the crystalline silicon semiconductor layer through the source contact hole, and a drain electrode of the second thin film transistor that is in contact with another portion of the crystalline silicon semiconductor layer through the drain contact hole, wherein where a portion of the oxide semiconductor layer that overlaps the main gate electrode is denoted as a gate opposing region, a portion thereof that is in contact with the source electrode as a source contact region and a portion thereof that is in contact with the drain electrode as a drain contact region, as seen from a direction normal to the substrate, the oxide semiconductor layer includes an offset region that is provided at least one of between the gate opposing region and the source contact region and between the gate opposing region and the drain contact region, and at least a portion of the offset region overlaps the sub-gate electrode with the first insulating layer and the second insulating layer therebetween.

16. The method for manufacturing a semiconductor device of claim 14, wherein the first thin film transistor has a channel-etch structure.

17. The method for manufacturing a semiconductor device of claim 14, wherein the oxide semiconductor layer includes an In—Ga—Zn—O-based semiconductor.

18. The method for manufacturing a semiconductor device of claim 17, wherein the oxide semiconductor layer includes a crystalline portion.

* * * * *